United States Patent
Tanaka et al.

(10) Patent No.: US 6,361,707 B1
(45) Date of Patent: Mar. 26, 2002

(54) APPARATUS AND METHODS FOR UPGRADED SUBSTRATE PROCESSING SYSTEM WITH MICROWAVE PLASMA SOURCE

(75) Inventors: Tsutomu Tanaka, Santa Clara; Mukul Kelkar, San Jose; Kevin Fairbairn, Saratoga; Hari Ponnekanti, Santa Clara; David Cheung, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/660,322

(22) Filed: Sep. 12, 2000

Related U.S. Application Data

(62) Division of application No. 09/480,923, filed on Jan. 11, 2000, which is a division of application No. 08/811,627, filed on Mar. 5, 1997, now Pat. No. 6,039,834.

(51) Int. Cl.[7] .............................................. H01L 21/00
(52) U.S. Cl. ........................ 216/69; 156/345; 438/726; 118/723 MW
(58) Field of Search ................. 118/723 MW, 118/723 ME, 723 AN; 216/69; 438/726, 727; 156/345

(56) References Cited

U.S. PATENT DOCUMENTS

| | | | |
|---|---|---|---|
| 3,906,892 A | 9/1975 | Van Cakenberghe | 118/49.1 |
| 4,006,340 A | 2/1977 | Gorinas | 219/121 P |
| 4,433,228 A | 2/1984 | Nishimatsu et al. | 219/10.55 R |
| 4,576,692 A | 3/1986 | Fukuta et al. | 204/165 |
| 4,736,304 A | 4/1988 | Doehler | 364/469 |
| 4,738,748 A | 4/1988 | Kisa | 156/643 |
| 4,831,963 A | 5/1989 | Saito et al. | 118/723 |
| 4,898,118 A | 2/1990 | Murakami et al. | 118/723 |
| 4,909,184 A | 3/1990 | Fujiyama | 118/723 |
| 4,946,549 A | 8/1990 | Bachman et al. | 156/643 |
| 4,996,077 A | 2/1991 | Moslehi et al. | 427/38 |
| 5,008,593 A | 4/1991 | Schlie et al. | 315/39 |
| 5,082,517 A | 1/1992 | Moslehi | 156/345 |
| 5,084,126 A | 1/1992 | McKee | 156/345 |
| 5,111,111 A | 5/1992 | Stevens et al. | 315/111.41 |
| 5,133,825 A | 7/1992 | Hakamata et al. | 156/345 |
| 5,134,965 A | 8/1992 | Tokuda et al. | 118/723 |
| 5,173,641 A | 12/1992 | Imahashi et al. | 315/111.41 |
| 5,211,995 A | 5/1993 | Kuehnle | 427/570 |

(List continued on next page.)

FOREIGN PATENT DOCUMENTS

| | | | |
|---|---|---|---|
| EP | 0 291 181 A2 | 11/1988 | H01J/37/32 |
| EP | 0 388 800 A2 | 9/1990 | H01J/37/32 |
| EP | 0 449 081 A2 | 10/1991 | C23C/16/50 |
| EP | 0 468 886 A2 | 1/1992 | H05H/1/46 |
| EP | 0 503 082 A1 | 9/1992 | B01J/19/08 |
| EP | 0697467 A1 | 2/1996 | C23C/16/44 |
| EP | 0 874 386 A2 | 10/1998 | H01J/37/32 |

*Primary Examiner*—Thi Dang
(74) *Attorney, Agent, or Firm*—Townsend & Townsend & Crew

(57) ABSTRACT

An apparatus and methods for an upgraded CVD system that provides a plasma for efficiently cleaning a chamber, according to a specific embodiment. Etching or depositing a layer onto a substrate also may be achieved using the upgraded CVD system of the present invention. In a specific embodiment, the present invention provides an easily removable, conveniently handled, and relatively inexpensive microwave plasma source as a retrofit for or a removable addition to existing CVD apparatus. In a preferred embodiment, the remote microwave plasma source efficiently provides a plasma without need for liquid-cooling the plasma applicator tube. In another embodiment, the present invention provides an improved CVD apparatus or retrofit of existing CVD apparatus capable of producing a plasma with the ability to efficiently clean the chamber when needed.

26 Claims, 17 Drawing Sheets

U.S. PATENT DOCUMENTS

| | | |
|---|---|---|
| 5,234,526 A | 8/1993 | Chen et al. .................. 156/345 |
| 5,234,529 A | 8/1993 | Johnson ...................... 156/345 |
| 5,266,364 A | 11/1993 | Tamura et al. .............. 427/571 |
| 5,282,899 A | 2/1994 | Balmashnov et al. ....... 118/723 |
| 5,306,985 A | 4/1994 | Berry ..................... 315/111.41 |
| 5,364,519 A | 11/1994 | Fujimura et al. ...... 204/298.38 |
| 5,387,288 A | 2/1995 | Shatas ................. 118/723 AN |
| 5,389,153 A | 2/1995 | Paranjpe et al. ...... 118/723 MP |
| 5,405,492 A | 4/1995 | Moslehi ...................... 156/643 |
| 5,449,434 A | 9/1995 | Hooke et al. ................. 216/70 |
| 5,462,602 A | 10/1995 | Misiano et al. ............. 118/718 |
| 5,466,991 A | 11/1995 | Berry .................... 315/111.41 |
| 5,489,362 A | 2/1996 | Steinhardt et al. .......... 156/643 |
| 5,498,308 A | 3/1996 | Kamarchi et al. .......... 156/345 |
| 5,520,771 A | 5/1996 | Kanai et al. ................. 156/345 |
| 5,540,812 A | 7/1996 | Kadomura ............... 156/652.1 |
| 5,545,289 A | 8/1996 | Chen et al. .............. 156/643.1 |
| 5,558,717 A | 9/1996 | Zhao et al. .................. 118/715 |
| 5,567,241 A | 10/1996 | Tsu et al. ........... 118/723 MW |
| 5,788,778 A | 8/1998 | Shang et al. .................... 134/1 |

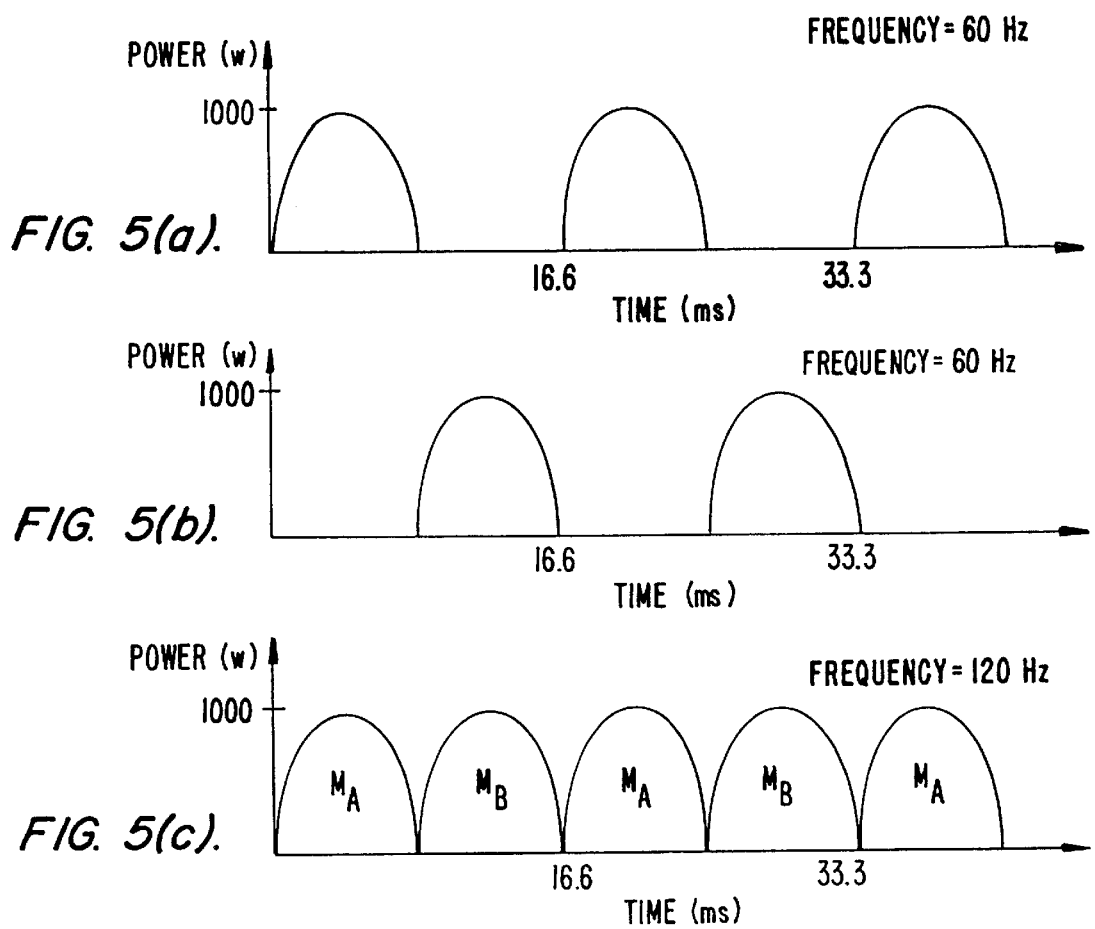

APPARATUS AND METHODS FOR UPGRADED SUBSTRATE PROCESSING SYSTEM WITH MICROWAVE PLASMA SOURCE

This application is a division of Ser. No. 09/480,923 filed Jan. 11, 2000 which is a division of Ser. No. 08/811,627 filed Mar. 5, 1997, U.S. Pat. No. 6,039,834.

BACKGROUND OF THE INVENTION

The present invention relates to substrate processing. More specifically, the present invention relates to apparatus and methods for upgrading a substrate processing system. Some embodiments of the present invention are particularly useful for cleaning a chamber in a substrate processing system. However, other embodiments of the present invention also may be useful for etching or depositing films on a substrate processed in the chamber.

One of the primary steps in the fabrication of modern semiconductor devices is the formation of a layer, such as an oxide layer, on a substrate or wafer. As is well known, an oxide layer can be deposited by chemical vapor deposition (CVD). In a conventional thermal CVD process, reactive gases are supplied to the substrate surface where heat-induced chemical reactions take place to produce a desired film. In a conventional plasma-enhanced CVD (PECVD) process, reactant gases are disassociated by the application of energy such as radio frequency (RF) energy to a reaction zone proximate the substrate surface, thereby creating a plasma of highly reactive species to produce the desired film.

During CVD processing, reactive gases released inside the processing chamber form layers such as silicon oxides or nitrides on the surface of a substrate being processed. However, deposition of undesired oxide or nitride residue can occur elsewhere in the CVD apparatus, such as in the area between the gas mixing block and gas distribution manifold, in or around the exhaust channel, and on the walls of the processing chamber during such CVD processes. Over time, failure to clean the residue from the CVD apparatus often results in degraded, unreliable processes and defective wafers. Typically, two types of cleaning procedures are used. Occurring between the processing of every wafer or every n wafers, the first cleaning procedure uses an etchant gas, optionally formed with a plasma, to remove residue from chamber walls and other areas. Occurring far less frequently than the first cleaning procedure, the second cleaning procedure involves opening the processing chamber and physically wiping the entire reactor—including the chamber walls, exhaust and other areas having accumulated residue—with a special cloth and cleaning fluids. Without these frequent cleaning procedures, impurities from the residue built up in the CVD apparatus can migrate onto the wafer. The problem of impurities causing damage to the devices on the substrate is of particular concern with increasingly small feature dimensions in modern devices. Thus, properly cleaning CVD apparatus is important for the smooth operation of substrate processing, improved device yield and better product performance.

Although effective chamber cleaning may be performed with conventional CVD apparatus, efficiency problems are encountered. Some conventional CVD apparatus, such as the parallel-plate capacitively coupled RF plasma CVD apparatus, have a processing chamber with integral RF sources that produce the plasma in situ. Thus, the first cleaning procedure may be performed without opening the processing chamber in such CVD apparatus. However, the plasma produced in the processing chamber may not be sufficient to clean all the areas with residue build-up, unless the duration of the cleaning operation is increased to compensate for the lower etch rate. However, this adversely affects substrate throughput and overall efficiency. Moreover, use of the RF plasma also causes ion bombardment of the metallic parts of the CVD apparatus, causing physical damage to the gas distribution manifold and to the inside chamber walls, and possibly leading to metal contamination problems.

Other conventional CVD apparatus having a separate processing chamber connected to a bulky, somewhat fragile remote microwave plasma system also introduce different efficiency problems. In such CVD apparatus, the entire remote plasma source, which includes a plasma applicator tube, a magnetron with power source, isolator, ultra-violet (UV) lamp, bulky waveguide and tuning assembly, is positioned over and securely fastened onto the lid of the processing chamber and extends down the side to the base of the chamber. Because the high breakdown efficiency with a microwave plasma results in a higher etch rate (on the order of about $2\mu m/min$) than is obtained with a capacitive RF plasma, these remote microwave plasma systems provide a plasma that can efficiently and adequately clean the residue without ion bombardment. Such remote microwave plasma systems typically utilize expensive, high wattage, continuous wave (CW) power supplies that power magnetrons to provide between about 2.5 to 6 kilowatts (kW) of microwave power. However, performing the second cleaning procedure (which is a serious, albeit necessary, interruption in the manufacturing of substrates) with these CVD apparatus may be even more time-consuming because the bulky, fragile remote microwave plasma system must be carefully removed from the top of the chamber, which needs to be opened for manual cleaning. In particular, the entire remote plasma source assembly needs to be unfastened near the top of the processing chamber as well as near the base of the chamber. Then the assembly needs to be carefully extracted from the processing chamber, without damaging any part of the entire assembly, while cleaning occurs. Often a difficult and unwieldy process, removing the bulky remote source further increases the total time required to perform preventive maintenance cleaning, and risks damaging the remote plasma source, which may be expensive to repair. Further, removing the bulky remote source involves removing the extensive waveguide system, and replacing the waveguide system requires a time-consuming quality control process to check for microwave leakage.

In addition to the above-described efficiency problems, use of CVD apparatus with conventional remote microwave plasma systems also introduces other problems including increased maintenance costs. In particular, these conventional microwave plasma systems, which have assemblies with configurations that require liquid cooling of the applicator tube, produce plasma in a relatively small physical space in the applicator tube (for example, a two-inch lengthwise section of an applicator tube having a 1 inch diameter) and thus require high power density, high cost, direct current (DC) microwave power supplies in order to obtain a high microwave coupling efficiency. The operation of such high power density power supplies thus results in increased utility bills. In addition, the plasma formed in this small space with magnetrons using such high power supplies has a high plasma density and the requisite cooling requirements of configurations often necessitate the use of a water-cooled or other liquid-cooled system. Typically, liquid-cooled systems are more expensive and have high maintenance costs, for example, providing coolant fluids. Also, liquid-cooled systems often suffer from leakage problems. Such leakage may lead to corrosion of the equipment, which may cause a degradation in the quality of the processed substrates. Moreover, frequent cleaning or even replacement of parts in the plasma source may be required due to the corrosion damage. In cases of extreme corrosion, the entire remote plasma source equipment or perhaps other equipment close to the remote plasma source may need to be replaced. Such cleaning and/or replacement procedures further interrupt the manufacturing of substrates. These types of delays have a negative economic impact on the manufacturer. Also, processing chamber maintenance for liquid-cooled systems requires removal of the plasma source, a time-consuming and involved process, that increases the total time manufacturing is interrupted.

From the above, it can be seen that it is desirable to have a modular, conveniently sized remote microwave plasma source assembly that permits economic and efficient cleaning of the CVD apparatus economically and efficiently, and that is easily handled and removable to reduce the amount of time needed for preventive maintenance cleaning. It is also desirable to provide a relatively inexpensive, yet high quality, remote microwave plasma source that may be a removable addition to or a retrofit of existing CVD apparatus, in order to upgrade performance of the CVD apparatus for improved cleaning ability while minimizing costs.

SUMMARY OF THE INVENTION

The present invention provides an apparatus and methods for an upgraded CVD system that provides a microwave-generated plasma able to efficiently clean a chamber, according to a specific embodiment. Etching or depositing a layer onto a substrate may also be achieved using the upgraded CVD system of the present invention. In a specific embodiment, the present invention provides an easily removable, conveniently handled, and relatively inexpensive microwave plasma source as a retrofit for or a removable addition onto existing CVD apparatus. In a preferred embodiment, the remote microwave plasma source efficiently provides a plasma without need for liquid cooling of the applicator tube. In another embodiment, the present invention provides an improved CVD apparatus or retrofit of existing CVD apparatus capable of producing a plasma that can efficiently clean the chamber when needed.

These and other embodiments of the present invention, as well as its advantages and features are described in more detail in conjunction with the text below and attached figures.

BRIEF DESCRIPTION OF THE DRAWINGS

FIGS. 5(a)–5(c) are graphs of power. as a function of time that illustrate dual magnetrons generating alternative pulsed (60 Hz) electric fields (2.45 GHz) to produce constant pulses at 120 Hz.

DETAILED DESCRIPTION OF THE SPECIFIC EMBODIMENTS

I. Exemplary CVD System

Figure 1A:
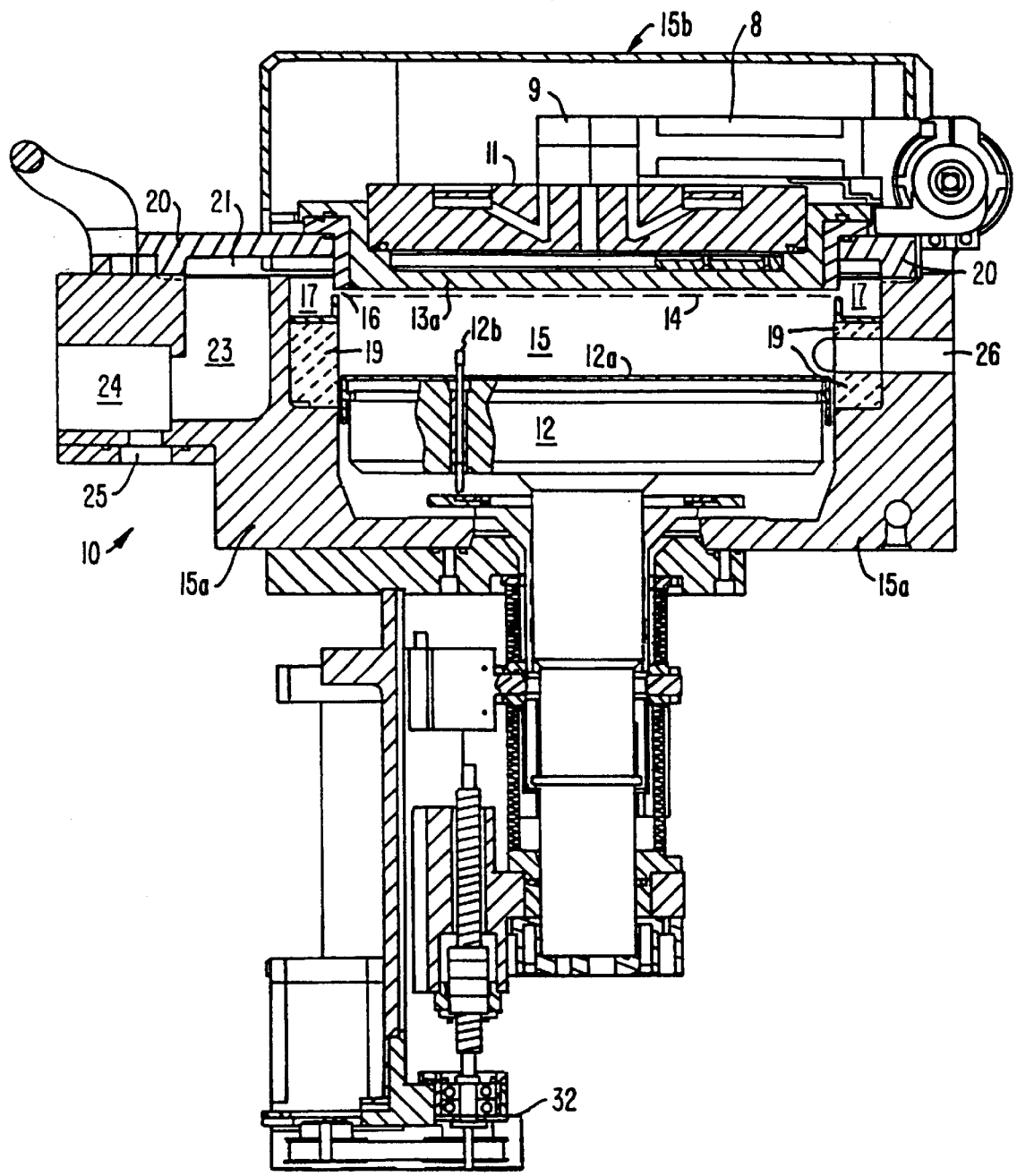
FIGS. 1(a) and 1(b) are vertical, cross-sectional views of one embodiment of a chemical vapor deposition apparatus according to the present invention.
Figure 1B:
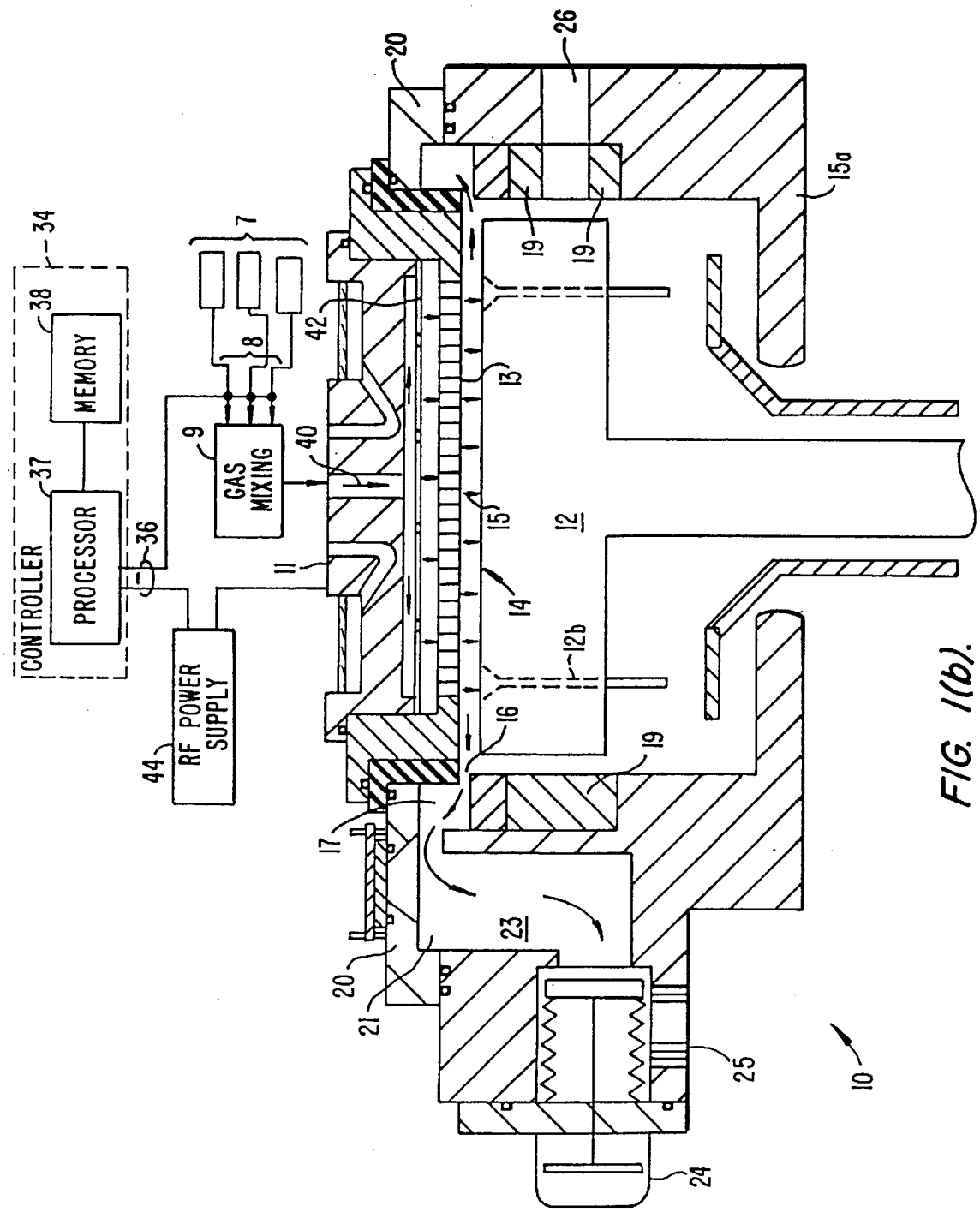
Figure 1C:
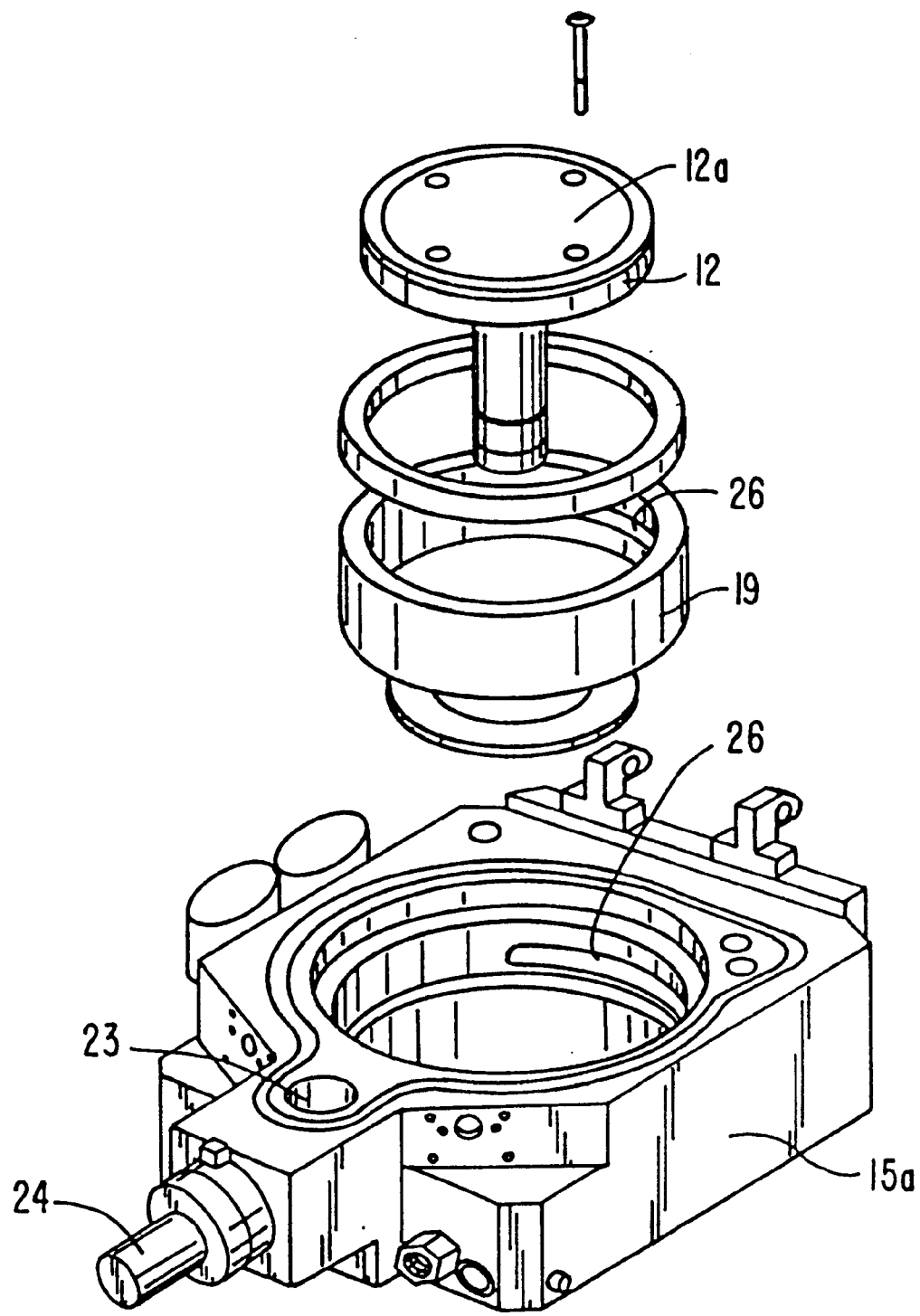
FIGS. 1(c) and 1(d) are exploded perspective views of parts of the CVD chamber depicted in FIG. 1(a)

Specific embodiments of the present invention may be used with or retrofitted onto a variety of chemical vapor deposition (CVD) processing machines. One suitable CVD apparatus with which the present invention can be used or retrofitted is shown in FIGS. 1(a) and 1(b), which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1(c) and 1(d).

Reactor 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. Pedestal 12 can be moved controllably between a lower loading/off-loading position (depicted in FIG. 1(a)) and an upper processing position (indicated by dashed line 14 in FIG. 1(a) and shown in FIG. 1(b)), which is closely adjacent to manifold 11. A centerboard (not shown) includes sensors for providing information on the position of the wafers.

Figure 1D:
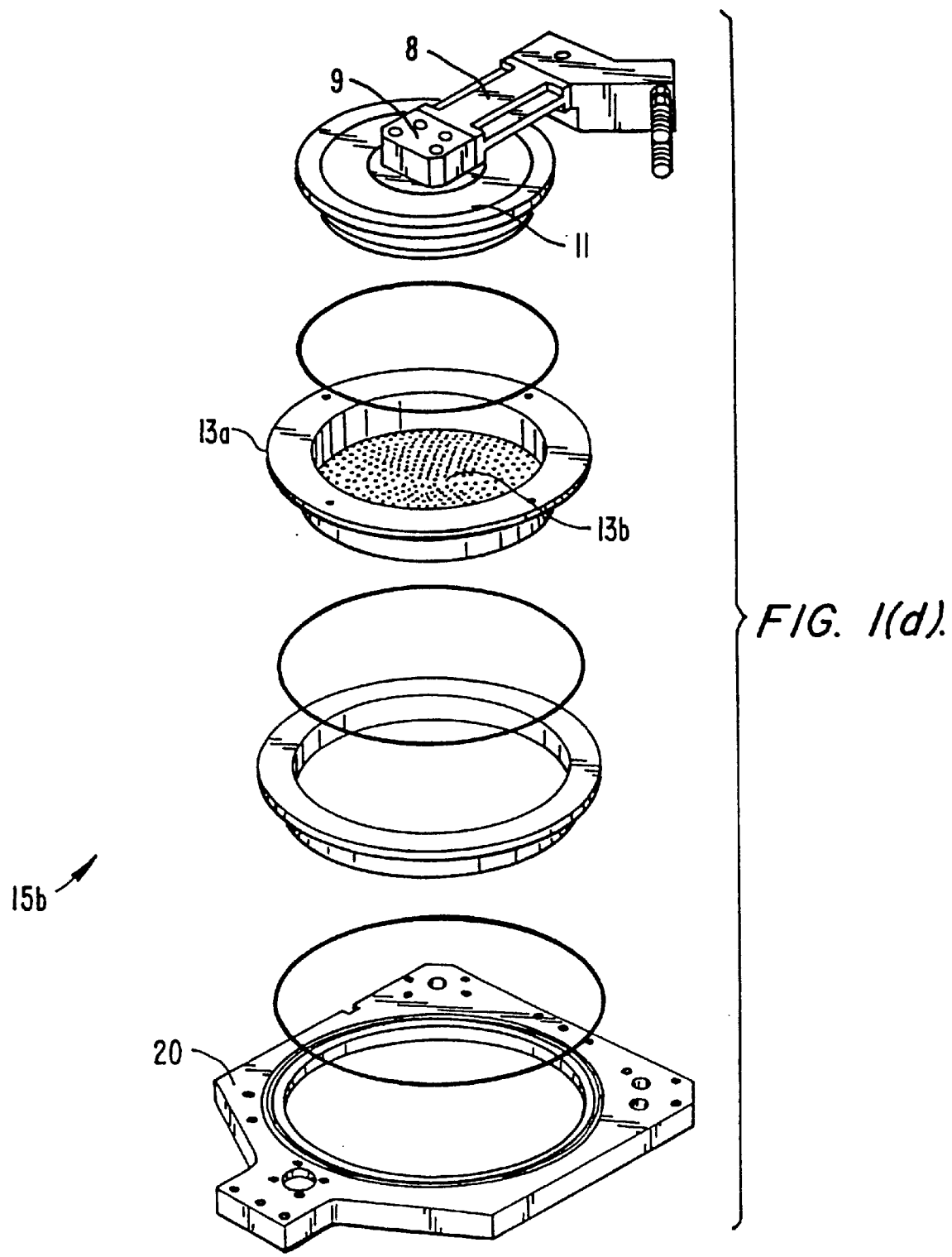

Deposition and carrier gases are introduced into chamber 15 through perforated holes 13b (FIG. 1(d)) of a conventional flat, circular gas distribution face plate 13a. More specifically, deposition process gases flow (indicated by arrow 40 in FIG. 1(b)) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1(b)) into a gas mixing block or system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. (This region will be referred to herein as the "reaction region"). Constituents of the plasma react to deposit a desired film on the surface of the semiconductor wafer supported on pedestal 12. RF power supply 44 can be a mixed frequency RF power supply that typically supplies power at a high RF frequency (RF1) of 13.56 MHz and at a low RF frequency (RF2) of 360 kHz to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture thermally reacts to deposit the desired film on the surface of the semiconductor wafer supported on pedestal 12, which is resistively heated to provide the thermal energy needed for the reaction.

During a plasma-enhanced deposition process, the plasma heats the entire reactor 10, including the walls of the chamber body 15a surrounding the exhaust passageway 23 and the shut-off valve 24. During a thermal deposition process, heated pedestal 12 causes heating of reactor 10. When the plasma is not turned on, or during a thermal deposition process, a hot liquid is circulated through the walls 15a of reactor 10 to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

The gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of resistively-heated pedestal 12 is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1(a)) raises and lowers the heater pedestal assembly 12 and its wafer lift pins 12b as wafers are transferred by a robot blade (not shown) into and out of the body of the chamber through an insertion/removal opening 26 in the side of the chamber 10. The motor 32 raises and lowers pedestal 12 between a processing position 14 and a lower wafer-loading position. The motor, valves or flow controllers connected to the supply lines 8, gas delivery system, throttle valve, RF power supply 44, and chamber and substrate heating systems are all controlled by a system controller 34 (FIG. 1(b)) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

Figure 1E:
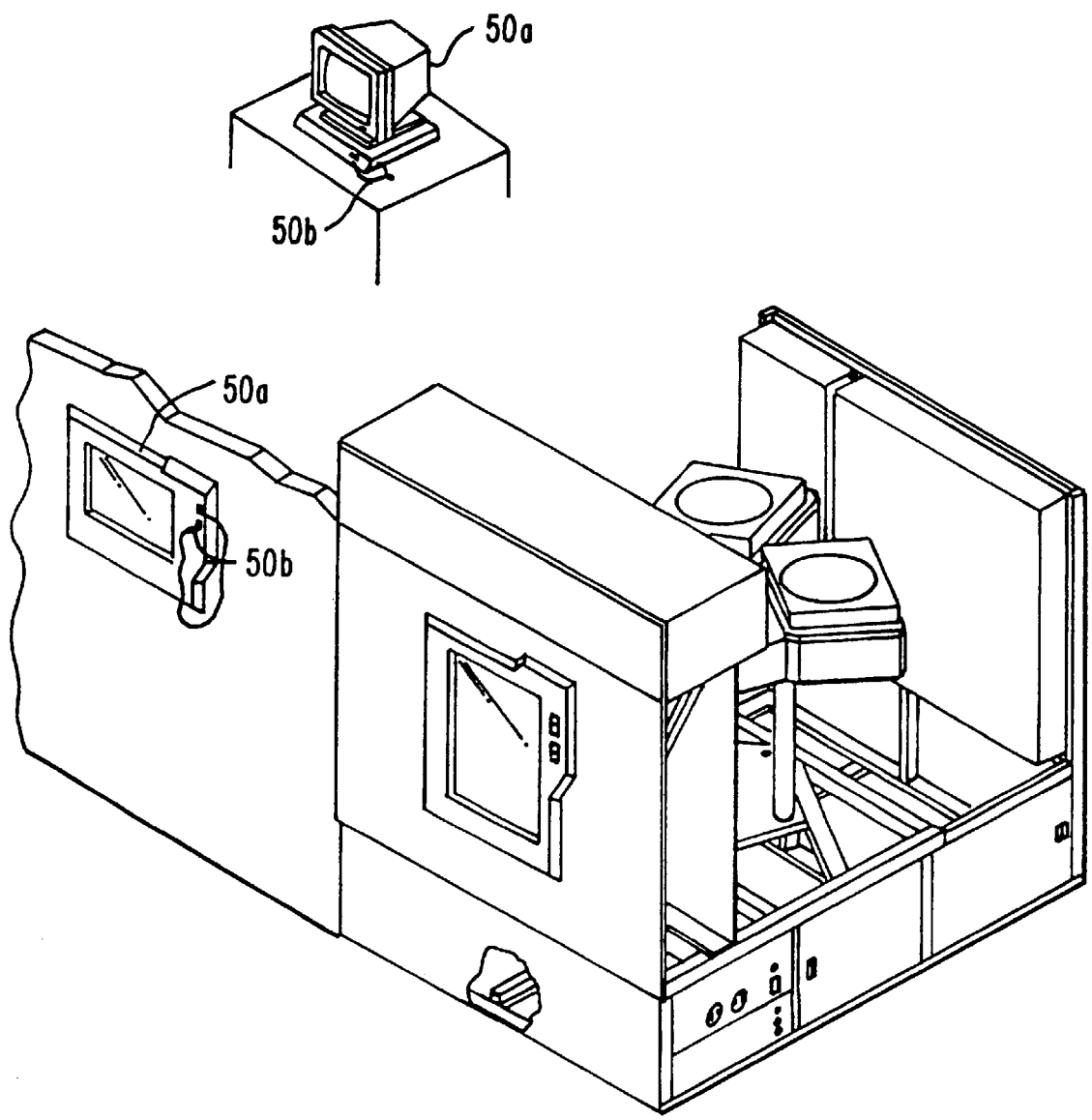
FIG. 1(e) is a simplified diagram of system monitor and CVD system 10 in a system which may include one or more chambers.

The interface between a user and controller 34 is via a CRT monitor 50a and light pen 50b, shown in FIG. 1(e), which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1F:
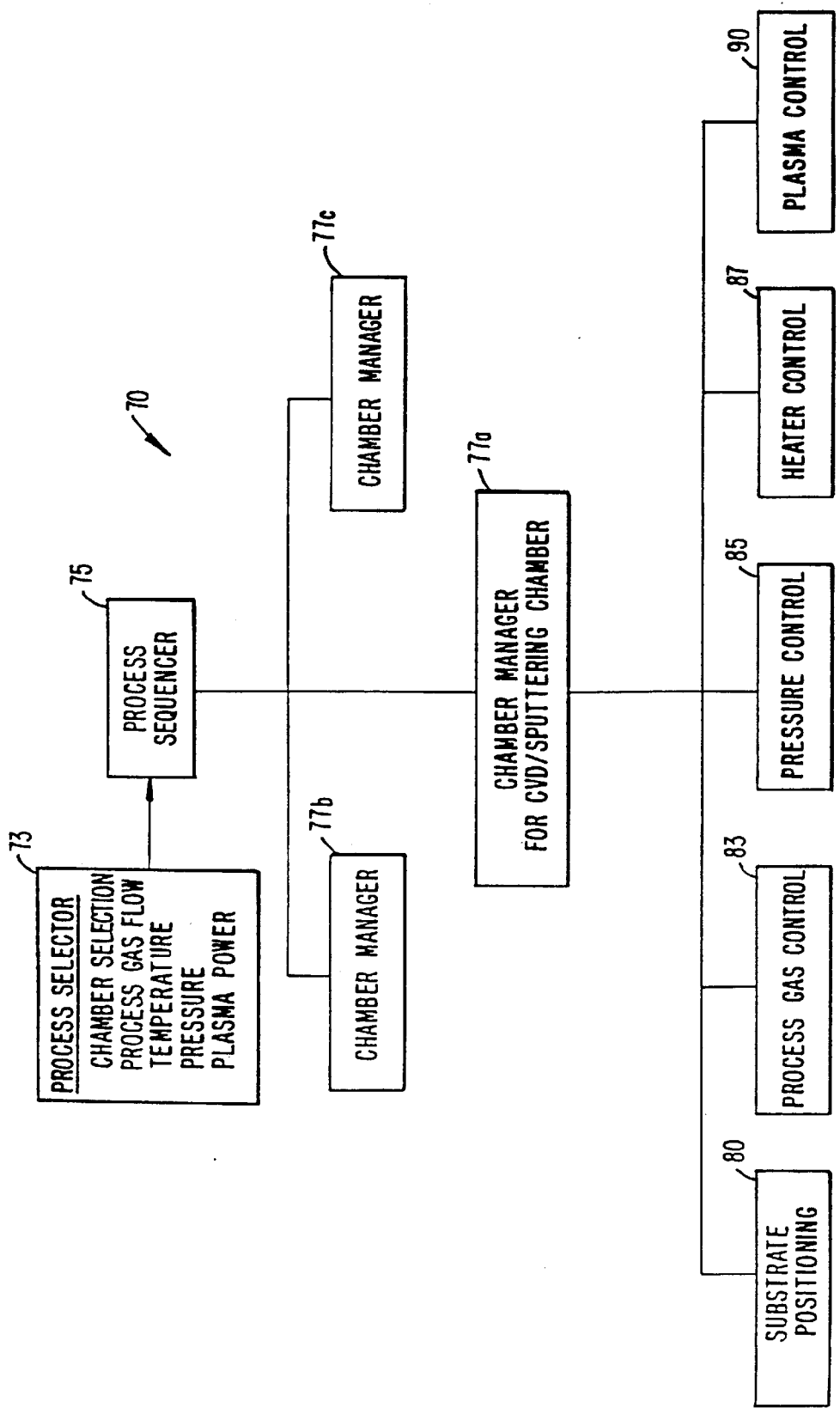
FIG. 1(f) shows an illustrative block diagram of the hierarchical control structure of the system control software, computer program 70, according to a specific embodiment.

FIG. 1(f) is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73 and for controlling operation of the various process chambers. Multiple users can enter process set numbers and process chamber numbers, or a user can enter multiple process set numbers and process chamber number, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1(f). The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, pedestal 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, tetraethylorthosilane ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 85 is invoked, the target pressure level is received as a parameter from the chamber manager subroutine 77a. The pressure control subroutine 85 operates to measure the pressure in the chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Plasma control subroutine 90 also includes program code for turning on and setting/adjusting the power levels applied to the magnetron(s). Similarly to the previously described chamber component subroutines, the plasma control subroutine 90 is invoked by the chamber manager subroutine 77a.

The above reactor description is mainly for illustrative purposes, and other equipment such as electron cyclotron resonance (ECR) plasma CVD devices, induction coupled RF high density plasma CVD devices, or the like may be used with the present invention to provide upgraded apparatus. Additionally, variations of the above-described system, such as variations in pedestal design, heater design, RF power frequencies, location of RF power connections and others are possible. For example, the wafer could be supported and heated by quartz lamps. The present invention is not limited to use with or retrofitting of any specific apparatus.

II. Exemplary Structures

Figure 2:
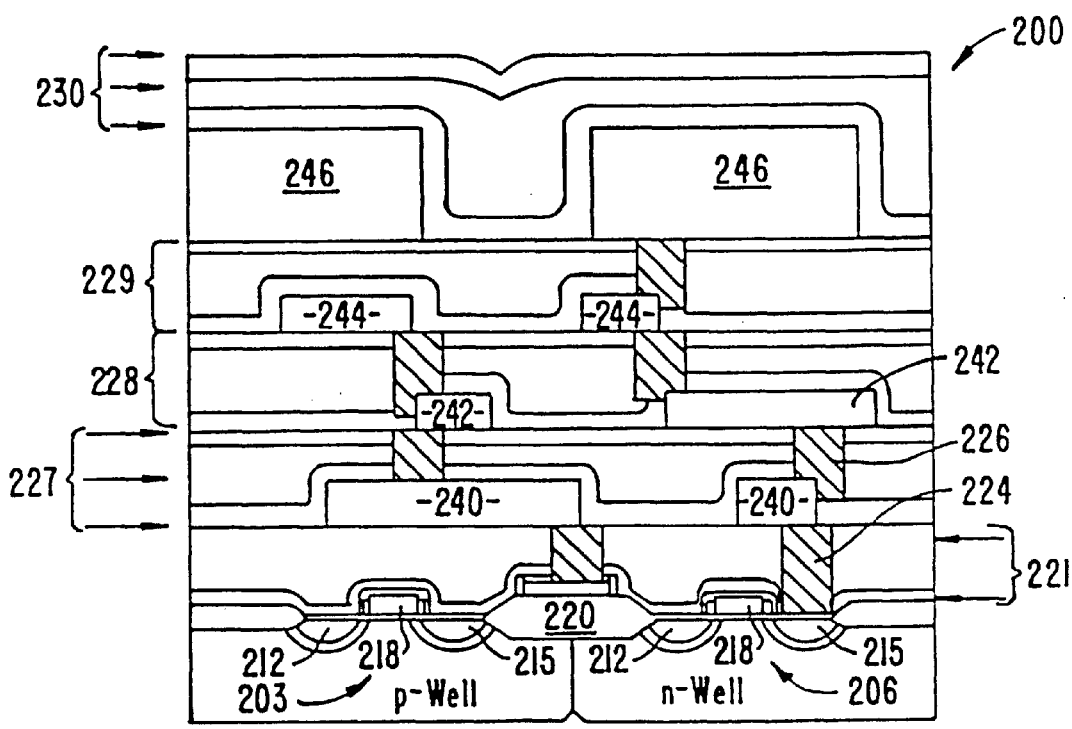
FIG. 2 is a simplified cross-sectional view of a semiconductor device manufactured according to the method of the present invention.

FIG. 2 illustrates a simplified cross-sectional view of an integrated circuit 200 which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

III. Specific Embodiments: Plasma Source Using Microwave Magnetron Assembly

According to specific embodiments of the present invention, an upgraded CVD apparatus may be provided by attaching a remote microwave plasma source to existing CVD apparatus or by retrofitting the existing CVD apparatus to incorporate a microwave plasma source. Although the discussion below focuses primarily on these specific embodiments, other embodiments within the scope of the invention will be apparent. Also, it should be noted that structures illustrated in FIGS. 3–6 are not necessarily drawn to scale.

Figure 3A:
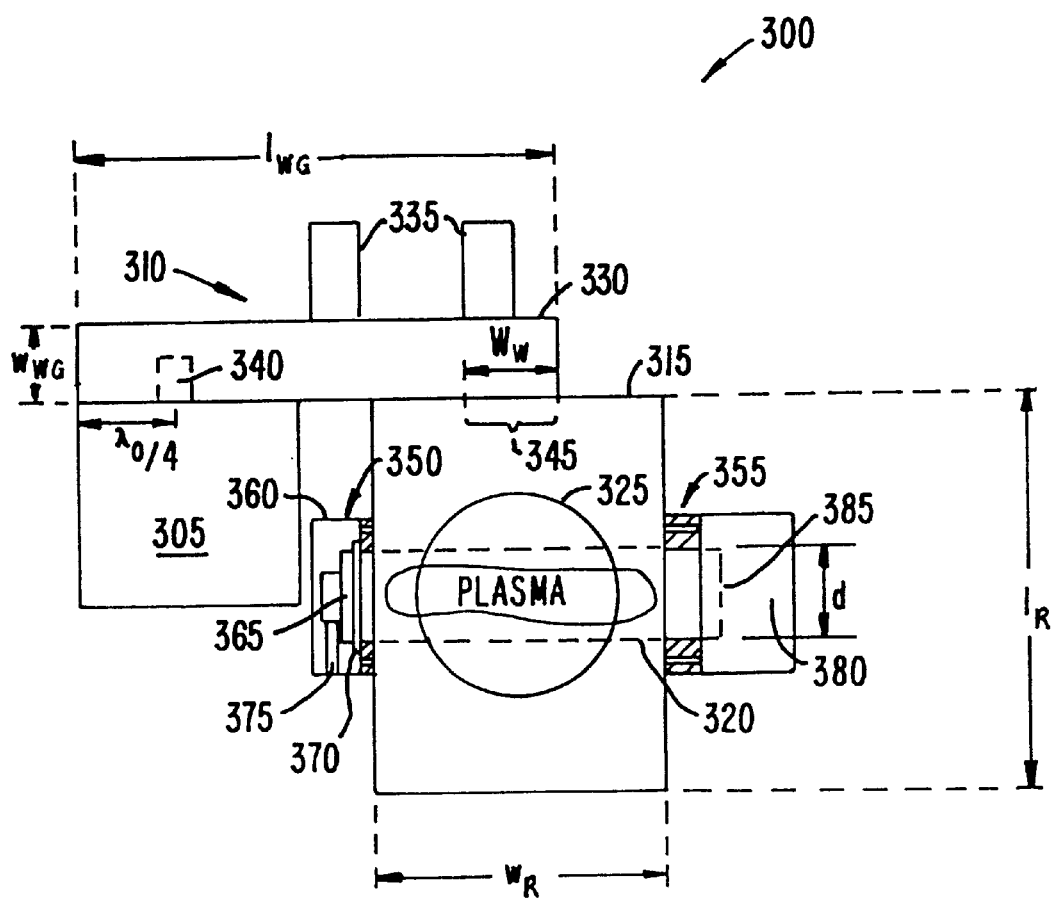
FIG. 3(a) is a top view of a remote microwave plasma source module 300 according to a specific embodiment of the present invention.
Figure 3B:
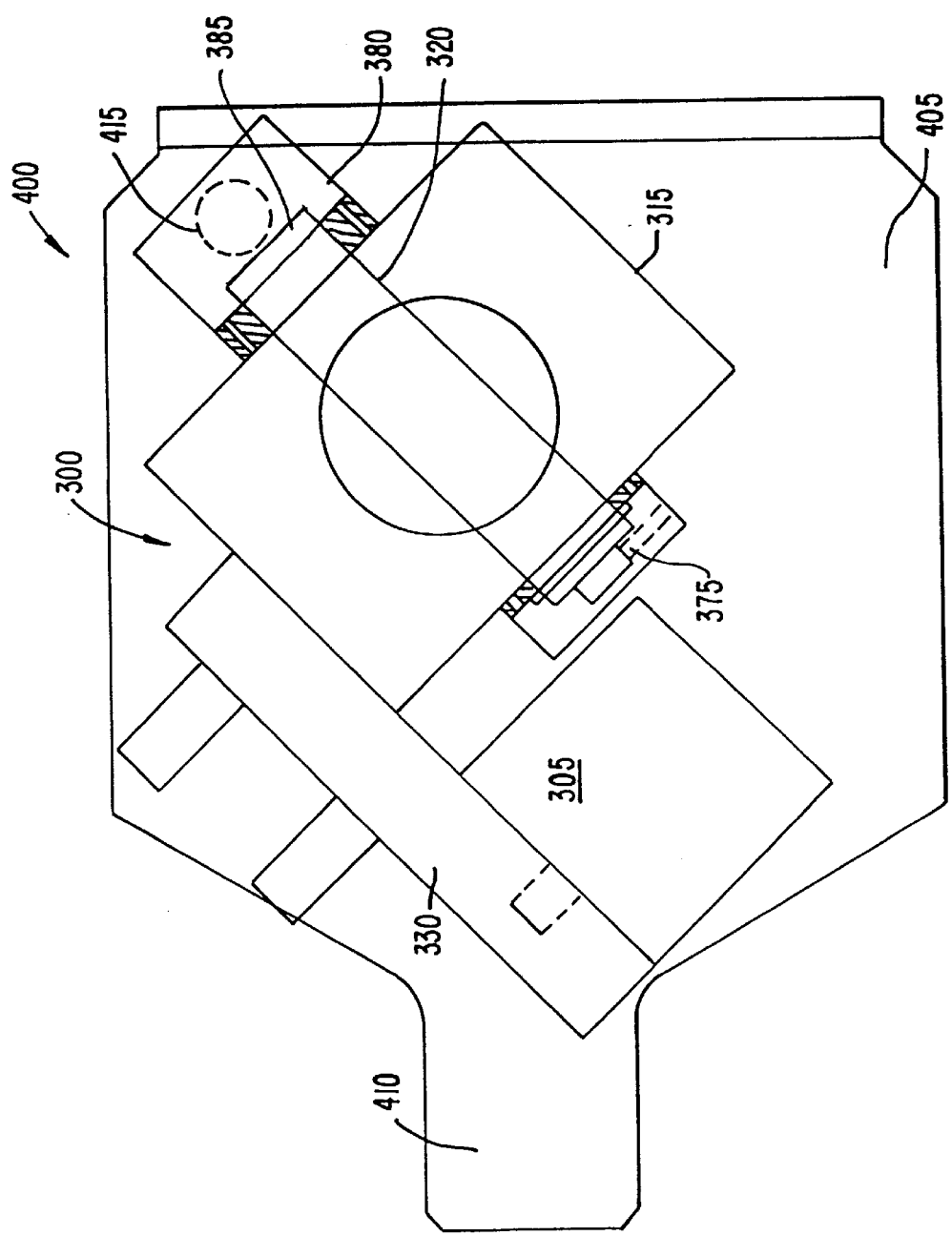
FIG. 3(b) is a top view of module 300 in relation with an exemplary processing chamber 400 for use therewith, according to the specific embodiment.

In accordance with a specific embodiment of the present invention, FIG. 3(a) shows the top view of a remote microwave plasma source module 300 attachable to the top lid of a chamber (for example, as shown in FIG. 3(b)). In this specific embodiment, the entire assembly of remote microwave plasma source module 300 includes a magnetron 305 coupled to a waveguide system 310, a resonator cavity 315 coupled to waveguide system 310 via a window 345, and a plasma discharge or applicator tube 320 (dotted lines) disposed through and within resonator cavity 315. Plasma discharge tube 320 includes an input end 365, coupled to a gas inlet 375, and an output end 385. Coupled to a gas source, gas feed line 375 introduces the reactive gases into discharge tube 320 where they may be energized by microwaves introduced into cavity 315 via window 345 from magnetron 305 to form a plasma in discharge tube 320. Radicals from the plasma formed then exit discharge tube 320 from output end 385 for use in the chamber.

More specifically, waveguide system 310 includes a waveguide section 330 and multiple tuning stubs 335 at multiple points along the length ($l_w$) of waveguide section 330 according to the specific embodiment. A stub antenna 340 of magnetron 305 couples microwaves to waveguide section 330. In the specific embodiment, waveguide section 330 may be a section of rectangular cross-sectional waveguide, but waveguides having other cross-sectional dimensions may be used in other embodiments. Part of waveguide section 330 is adjacent to magnetron 305 at one end and adjacent to resonator cavity 315 at its other end. Preferably, waveguide section 330 is adjacent and integrally formed at this other end with part of resonator cavity 315. Waveguide section 330 is closed except for a window 345 at this other end to resonator cavity 315. Waveguide system 310 may also optionally include other optimizing features, such as directional couplers or a phase detector to monitor reflected power and/or an isolator with a load to absorb any reflected microwave power that could otherwise damage the magnetron. As described above, microwaves from magnetron 305 are transmitted through waveguide section 330, enter cavity 315 via window 345, and energize reactive gases in discharge tube 320.

In module 300, discharge tube 320 is disposed through and contained within resonator cavity 315, such that the length of discharge tube 320 substantially corresponds to the width ($W_R$) of resonator cavity 315. Discharge tube 320 is substantially disposed through cavity 315, and is located such that, lengthwise, discharge tube 320 coincides with a maximum of the radiation, for example, the electric field (E-field) component of the microwaves, within cavity 315. Discharge tube 320 is a tube with circular cross section, according to the specific embodiment. The ends of discharge tube 320 are connected onto resonator cavity 315 by a first mount assembly 350 and a second mount assembly 355. First mount assembly 350 includes a housing 360 that contains and holds input end 365 of discharge tube 320, which is fastened onto resonator cavity 315 by screws (alternatively, other fasteners or epoxies may be used) through corresponding holes in a wall of resonator cavity 315 and in assembly 350. End 365 has a sealing member 370, preferably an O-ring, about its outer diameter to prevent vacuum loss from discharge tube 320. End 365 is an open, vacuum-sealed end that is gas-tight except for gas feed line 375 coupled to housing 360. Second mount assembly 355, which is connected to an outlet manifold 380 that contains and holds the output end 385 of discharge tube 320, is fastened onto resonator cavity 315 by screws (alternatively, other fasteners or epoxies may be used) through corresponding holes in the opposite wall of resonator cavity 315 and in assembly 355. Output end 385 of discharge tube 320 is open-ended and leads to the inside of outlet manifold 380, connectable to a gas introduction line of a processing chamber. Optionally, end 385 also may have a sealing member about its outer diameter to prevent leakage between tube 320 and the gas introduction line. Optimally, second mount assembly 355 is extended in length, as compared to first mount assembly 350, to provide adequate distance between the outlet of discharge tube 320 and a sealing member that might be used at end 385. Accordingly, the sealing member does not melt due to the elevated temperatures from the outgoing plasma species at the outlet of discharge tube 320.

Module 300 also includes an air-cooling path 325 in a compact, easily handled module that may be attached to a processing chamber, as shown in FIG. 3(b). Air-cooling path 325 allows air directed from a fan (not shown) to be flowed around discharge tube 320. Heat generated in discharge tube 320 due to microwave plasma generation is thereby dissipated by air cooling, rather than liquid cooling.

Remote microwave plasma source module 300 uses magnetron 305 as the source for energy-directed through waveguide system 310 to resonator cavity 315 for forming a plasma in discharge tube 320 within resonator cavity 315. Although a number of different microwave power supplies are available, the present invention utilizes inexpensive pulsed, low wattage power supplies to generate between about 1–1.5 kW microwave power from the magnetron(s), rather than expensive, high wattage, continuous wave (CW) power supplies to generate typically between about 2.5–6 kW microwave power from the magnetron(s). In preferred embodiments, magnetron 305 (e.g., the type of magnetron employed in some microwave ovens) is powered by a low cost, low wattage, pulsed 60 Hertz (Hz) half-rectified power source (which contains large ripples) to provide microwaves having a frequency of about 2.45 Gigahertz (GHz). Such pulsed, low wattage microwave generators can be at least two orders of magnitude lower in price than a high power CW microwave generator or an RF generator.

Microwave energy is transmitted from magnetron 305 via waveguide system 310 to resonator cavity 315 containing discharge tube 320. In particular, microwave radiation from stub antenna 340 of magnetron 305 is communicated to waveguide system 310. Stub antenna 340 is located on the order of substantially about a quarter-wavelength (at the operating microwave frequency) or its optimized equivalent distance away from an end of waveguide section 330, according to the specific embodiment. Alternatively, stub antenna 340 may be replaced in a manner that is well known to one of ordinary skill in the art with a slot antenna or other radiating element that is able to communicate the microwaves from magnetron 305 to waveguide system 310. Waveguide section 330 has the dimensions needed simply to direct the magnetron's microwave energy to resonator cavity 315 rather than selectively guiding particular modes. Also, waveguide section 330 may be of a length sufficient to accommodate close proximity and modularity with the magnetron sources used and with resonator cavity 315. In the specific embodiment, waveguide section 330 has a length ($l_{WG}$) of about 10 inches, a width ($W_{WG}$) of about 1.7 inches, and a height ($h_{WG}$) of about 3.4 inches.

In accordance with a specific embodiment, part of waveguide section 330 is integral to resonator cavity 315 and has an unobstructed opening, window 345, to the interior of resonator cavity 315. The E-field component of the $TE_{10}$ mode of the microwaves transmitted through window 345 varies along planes that are parallel to the wall of resonator cavity 315 having window 345. In the specific embodiment, window 345 couples waveguide section 330 and resonator cavity 315. In this embodiment, window 345 is a rectangular opening with a length ($l_W$) of about 2 inches and a width ($W_W$) of about 1 inch that is located substantially in the center of the wall of resonator cavity 315. In the specific embodiment, $l_W$ may substantially correspond with or be slightly less than $h_{WG}$. In other embodiments, window 345 may be equipped with a dielectric window (or other microwave transparent material) or be replaced by a stub antenna or other radiating element, as is well known. Tuning stubs 335 along the length of waveguide section 330 may be used to tune the mode/phase of the microwaves that exit waveguide section 330 from window 345. Although only two tuning stubs 335 are shown, alternative embodiments may include more or fewer stubs as desired.

Reactive gases that are supplied to discharge tube 320 via gas feed line 370 can thereby be energized by the microwaves resonating in cavity 315. Standing waves of microwave energy form inside resonator cavity 315 and energize the reactive gases within discharge tube 320 virtually along the tube's entire length, which substantially corresponds to the width ($W_R$) of cavity 315. Resonator cavity 315 and waveguide system 310 may be constructed of metal, such as copper, aluminum, stainless steel, or other conducting material. According to the specific embodiment, resonator cavity 315 is a single-mode cavity having a length ($l_R$) of about 7 inches, $W_R$ of about 6 inches, and a height ($h_R$) of about 5.1 inches, with the dominant mode being the $TE_{102}$ mode of the microwaves having a frequency of about 2.45 GHz (assuming a "direction of propagation" along the axis of $l_R$ and perpendicular to the length of discharge tube 320). Cavity 315 may be a multi-mode cavity by, for example, increasing the width ($W_R$) of cavity and the length of discharge tube 320.

In some preferred embodiments, at least one of the walls of resonator cavity 315 may be movable to allow resonance tuning by adjusting the position of the wall(s). As mentioned above, tuning using stubs 335 may be performed in response to the impedance changes caused by the introduction of reactive gases and subsequent ionization of the reactive gases in discharge tube 320. The above-described embodiments utilize single mode resonance. However, alternative embodiments may use different dimensions for resonator cavity 315 to take advantage of multimode resonance or to account for use of other frequencies besides about 2.45 GHz. Use of a resonator cavity that accommodates multi-mode resonance would increase ionization of reactive gases in discharge tube 320 and enable microwaves to be coupled to a discharge tube longer than that used with the resonator cavity 315 of the specific embodiment of FIG. 3(a). With a longer discharge tube, more reactive gases would be subjected to disassociation by the microwaves applied along the length of the discharge tube, resulting in increased ionization.

Discharge tube 320 preferably may be made of a dielectric material that is fairly transparent to microwaves and resistant to etching by radicals in the plasma, such as alumina in either the ceramic or sapphire form. The length of discharge tube 320 should correspond approximately to $W_R$, or slightly longer to accommodate O-rings on the ends of discharge tube 320. Discharge tube 320 should be located within resonator cavity 315 such that the diameter of discharge tube 320 overlaps with a radiation pattern maximum, for example, an E-field maximum, along the length of tube 320. Also, the diameter of discharge tube 320 should be greater than about a quarter-wavelength at the operating microwave frequency so that the diameter of discharge tube 320 overlaps along its length with at least one radiation (e.g., E-field) maximum. Preferably, the diameter and placement of discharge tube 320 is optimized so that a plasma can be struck in tube 320 and so that ionization of the gases in the center of tube 320 can occur. According to the specific embodiment, which utilizes a single-mode cavity 315, discharge tube 320 in is constructed of alumina and preferably has an outer diameter of about 1.87 inches with an inner diameter of about 1.65 inches, and a length of about 6–8 inches, most preferably 7.8 inches. Of course, for embodiments utilizing a multi-mode cavity, the diameter of discharge tube 320, appropriate placed, should preferably be large enough to overlap along the discharge tube's length with at least one radiation (e.g., E-field) maximum of each mode.

With the present invention, a plasma can be struck in tube 320 without the use of a UV lamp, which allows more economic use of space in the module. The vacuum of the processing chamber causes radicals in the microwave-generated plasma to exit discharge tube 320 via outlet manifold 380 and be subsequently provided to the connected vacuum chamber. Due to changes in impedance within resonator cavity 315 from the introduction and ionization of reactive gases within discharge tube 320, use of tuning stubs 335 optimizes the microwave energy coupling. In alternative preferred embodiments, E-field detectors or probes, such as multiple directional couplers or a phase detector, may be installed to gauge the microwave energy within waveguide 330 and enable automated tuning of stubs 335 via robotized motors under the control of system controller 34 which would be connected to receive the measurements from the E-field detectors or probes.

As seen in FIGS. 3(a) and 3(b), the overall physical dimensions (about 12 inches wide, about 12 inches long, and about 8 inches high) of module 300 are compact and able to be packaged into an easily handled unit, according to the specific embodiment. Advantageously, remote module 300 does not require a UV lamp and has a compact waveguide system, unlike conventional bulky remote microwave plasma sources. Because of the physical configuration of the entire assembly, remote microwave plasma source module 300 is able to use low cost, pulsed, low wattage power supplies for the magnetrons instead of the expensive, high power, CW power supplies, without sacrificing high microwave coupling efficiency. More particularly, microwaves resonating in resonator cavity 315 are able to energize reactive gases within discharge tube 320 along its the entire length within resonator cavity 315. In the embodiment of FIG. 3(a), the gas molecules in discharge tube 320 will have a relatively long residence time (about 0.016 seconds). Accordingly, even with the use of the low wattage, pulsed power supplying the magnetron to produce microwave energy of about 1–1.5 kW, the remote plasma source module 300 is able to achieve high microwave coupling efficiency.

In particular, the amount of microwave energy coupled into the plasma for a given volume of discharge tube 320 is between about 80–100%.

Conventional waveguide coupling methods and apparatus which couple microwaves to small sections of a discharge tube require liquid-cooling systems due to the high levels of heat caused by the high energy concentration. Because the energy density using the present design of discharge tube 320 and resonator cavity 315 is significantly lower than the high energy density of these conventional methods, lower levels of heat are distributed to the wide area of discharge tube 320 within resonator cavity 315 in the specific embodiment. The heat is dissipated faster due to the increased area of discharge tube 320 where plasma is formed. Forced air from a fan through air path 325 is sufficient to dissipate the heat distributed on discharge tube 320. Since the thermal gradient is shallower with the present invention, discharge tube 320 has a longer, useful life span. Since discharge tube 320 does not need to be replaced as frequently, the present invention helps reduce maintenance costs. In addition, specific embodiments of the present invention avoid corrosion associated with liquid cooling systems, resulting in extended life spans for the metal components of module 300 which therefore need replacement less frequently.

Remote microwave plasma module 300 has a small footprint, allowing easy attachment onto the top of the processing chamber or other convenient location with minimal effort, as seen in FIG. 3(b), which is a top view of module 300 and processing chamber 400. Processing chamber 400 shown in FIG. 3(b) is an exemplary processing chamber with which module 300 may be seated and attached for use therewith. Processing chamber 400 has a relatively flat top surface or lid 405, which has a broad area and polygonal shape, as is typical with many CVD processing chambers. In the specific embodiment, lid 405 and chamber 400 taper into a reduced area 410 which is proximate to the throttle valve and gas exit. Lid 405 also includes an inlet 415 (shown in dotted line) accessible either by a top end or a bottom end through which reactive gases may be introduced into processing chamber 400 by passing through gas passages (in arm 8 of FIG. 1(a) and FIG. 1(d)) to the gas mixing block and through gas distribution plate 13. Normally, deposition gases enter the bottom end of inlet 415 (while its top end is closed), pass through the gas passages to the gas mixing block and through the gas distribution plate into the chamber. In the specific embodiment, the top end of inlet 415 may directly connect to outlet manifold 380 of module 300, where a separate feed line (not shown) may be used to connect the inlet 415 via its top end to end 385 of discharge tube 320, allowing radicals to pass from discharge tube 320 into inlet 415 (while its bottom end is closed).

With module 300 placed on top of lid 405 and secured onto processing chamber 400, reactive gases may be fed into feed line 375 and module 300 may be powered up for cleaning operation of processing chamber 400 as needed. Upon being powered up, a plasma is formed from reactive gases in discharge tube 320 and radicals from the plasma exit tube 320. Accordingly, downstream areas with oxide or nitride residue in processing chamber 400 are cleaned by the radicals in the plasma fed out of module 300 and into inlet 415. Inlet 415 leads to gas passages within arm 8 to gas mixing block 9, which is coupled via the gas distribution plate 13 to chamber 15. Residues in processing chamber 400 between the gas mixing block and the gas exhaust outlet, and residues between inlet 415 and the gas mixing block, are cleaned by the radicals from the attached remote microwave plasma source module 300. From processing chamber 400, an exhaust system using a vacuum pump system then exhausts the residue and gases via ports into a vacuum manifold and out an exhaust line. The pressure at which the gases and residue are released through the exhaust line is controlled by a throttle valve and pumping system.

Further embodiments of the present invention may utilize more than one discharge tube, more than one magnetron, or have variations on the physical configuration while maintaining or improving the modularity and efficiency of module 300. The embodiment illustrated in FIG. 3(a) and 3(b) utilizes one discharge tube 320 within resonator cavity 315. However, two or more discharge tubes within resonator cavity 315 may also be used in other embodiments. It is recognized that the input feed lines in the specific embodiments have mass flow controllers or valves to control the flow of reactive gases into the discharge tube(s). Additionally, multiple discharge tubes may employ separate or shared input feeds and/or separate or shared output feeds, or combinations thereof.

Figure 3C:
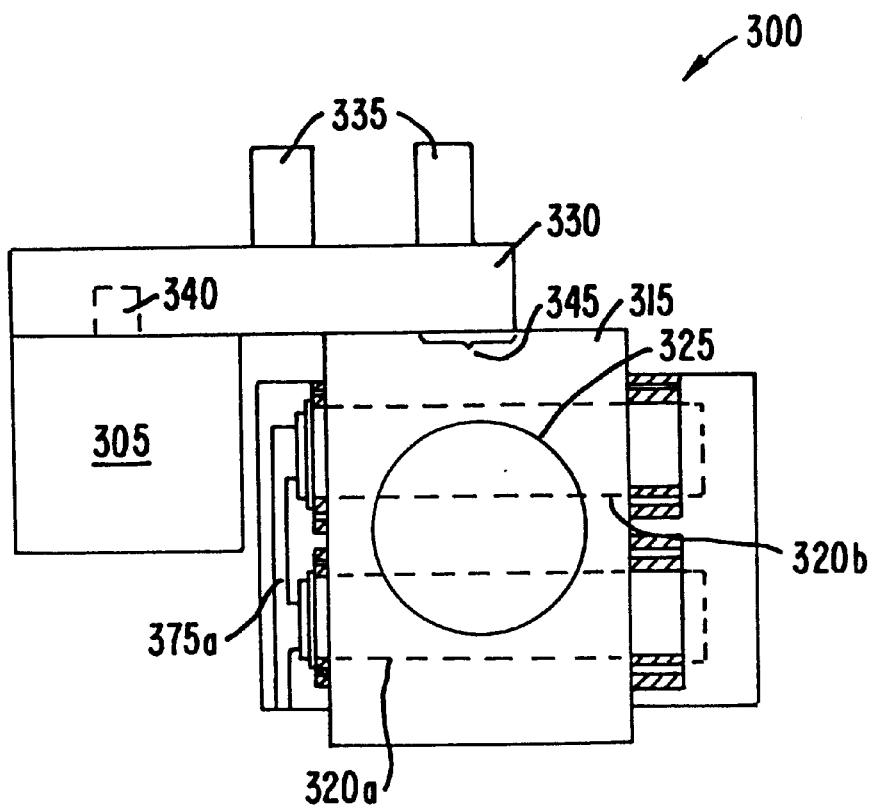
FIG. 3(c) is a top view illustration of another embodiment of module 300 including two discharge tubes 320a and 320b within resonator cavity 320.

As an example, FIG. 3(c) is a top view illustration of another embodiment of module 300 including multiple, for example two, discharge tubes 320a and 320b within resonator cavity 320. FIG. 3(c) illustrates an embodiment where discharge tubes 320a and 320b have a shared input feed 375a and separate outputs, which may connect either to a shared output feed (not shown) to one inlet 415 or to separate output feeds (not shown) to different inlets of processing chamber 400. Using multiple discharge tubes increases the amount of gas energized and allows high gas flow rates into the discharge tubes to achieve the same ionization levels as compared with a single discharge tube.

Figure 3D:
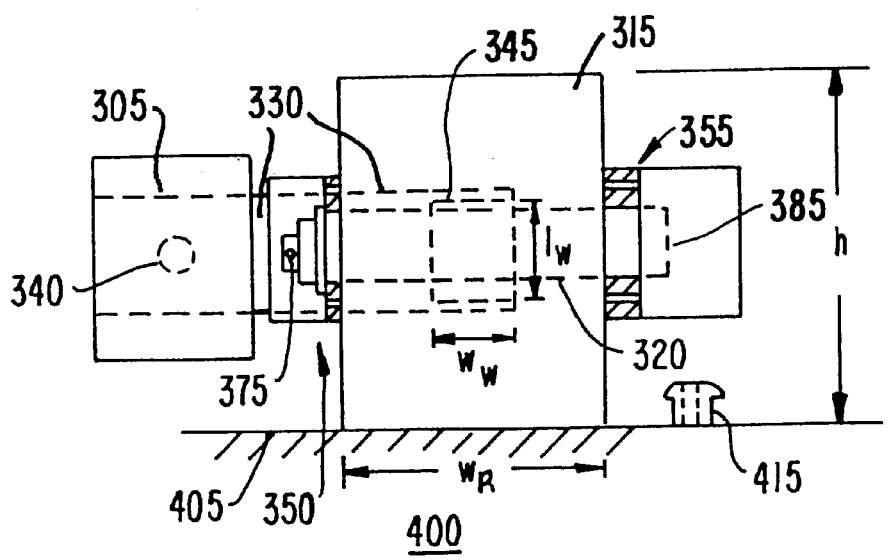
FIG. 3(d) is a side view of a portion of module 300 of either FIG. 3(a) or FIG. 3(c), shown in relation to lid 405 of processing chamber 400.

FIG. 3(d) is a side view of a portion of module 300 of either FIG. 3(a) or FIG. 3(c) shown in relation to lid 405 of processing chamber 400. In particular, FIG. 3(d) illustrates a side view of resonator cavity 315, discharge tube(s) 320, magnetron 305 and waveguide section 330. Inlet 415 of processing chamber 400 may be connected via a feed line (not shown) to end(s) 385 of discharge tube(s) 320. The modular, compact nature of remote microwave plasma source module 300 may be provided regardless of whether a single discharge tube or multiple discharge tubes are used.

Figure 3E:
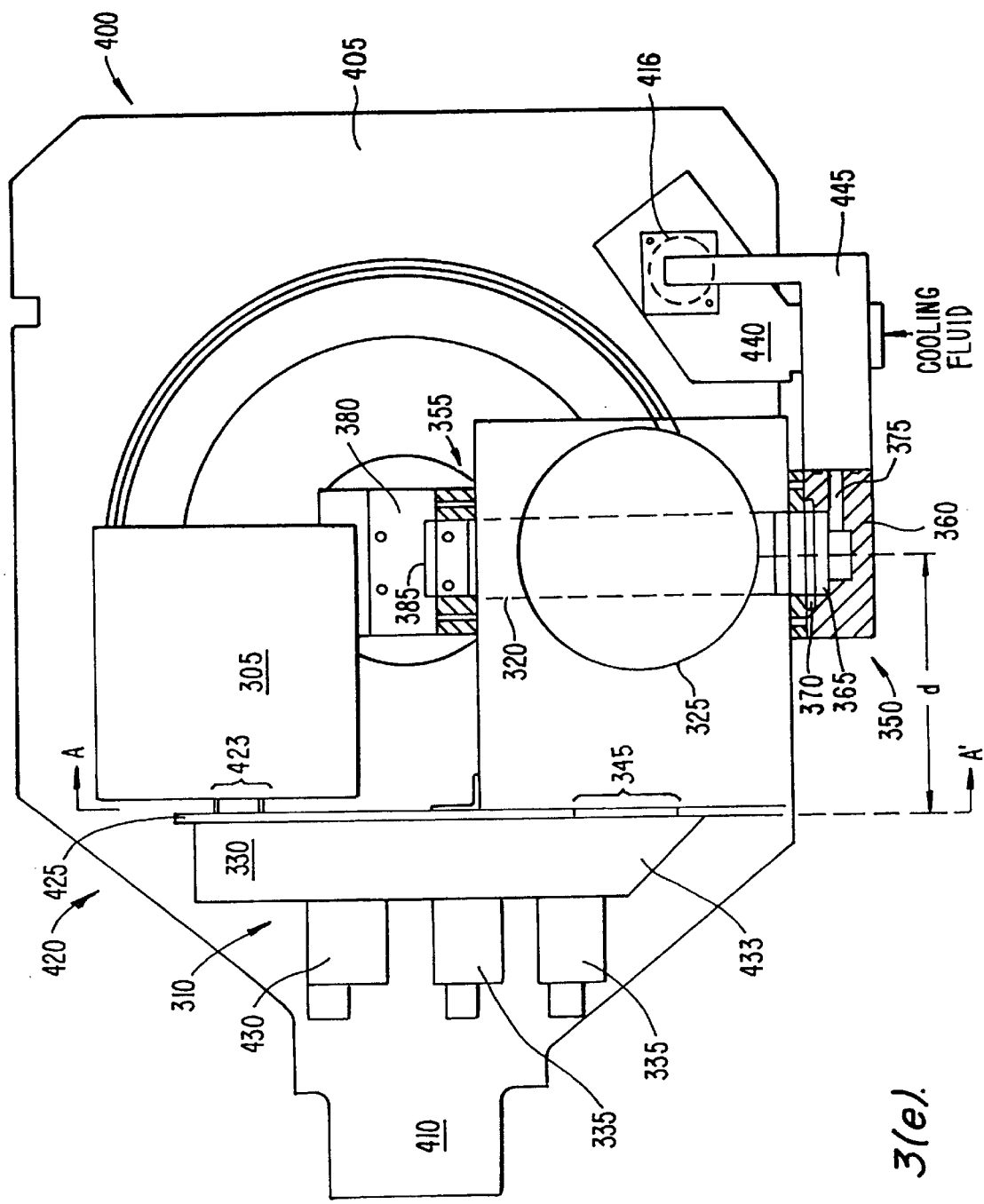
FIGS. 3(e) and 3(f) are top and side views, respectively, of a remote microwave plasma source module 420 in relation to an exemplary chamber 400 for use therewith, according to another specific embodiment of the present invention.
Figure 3F:
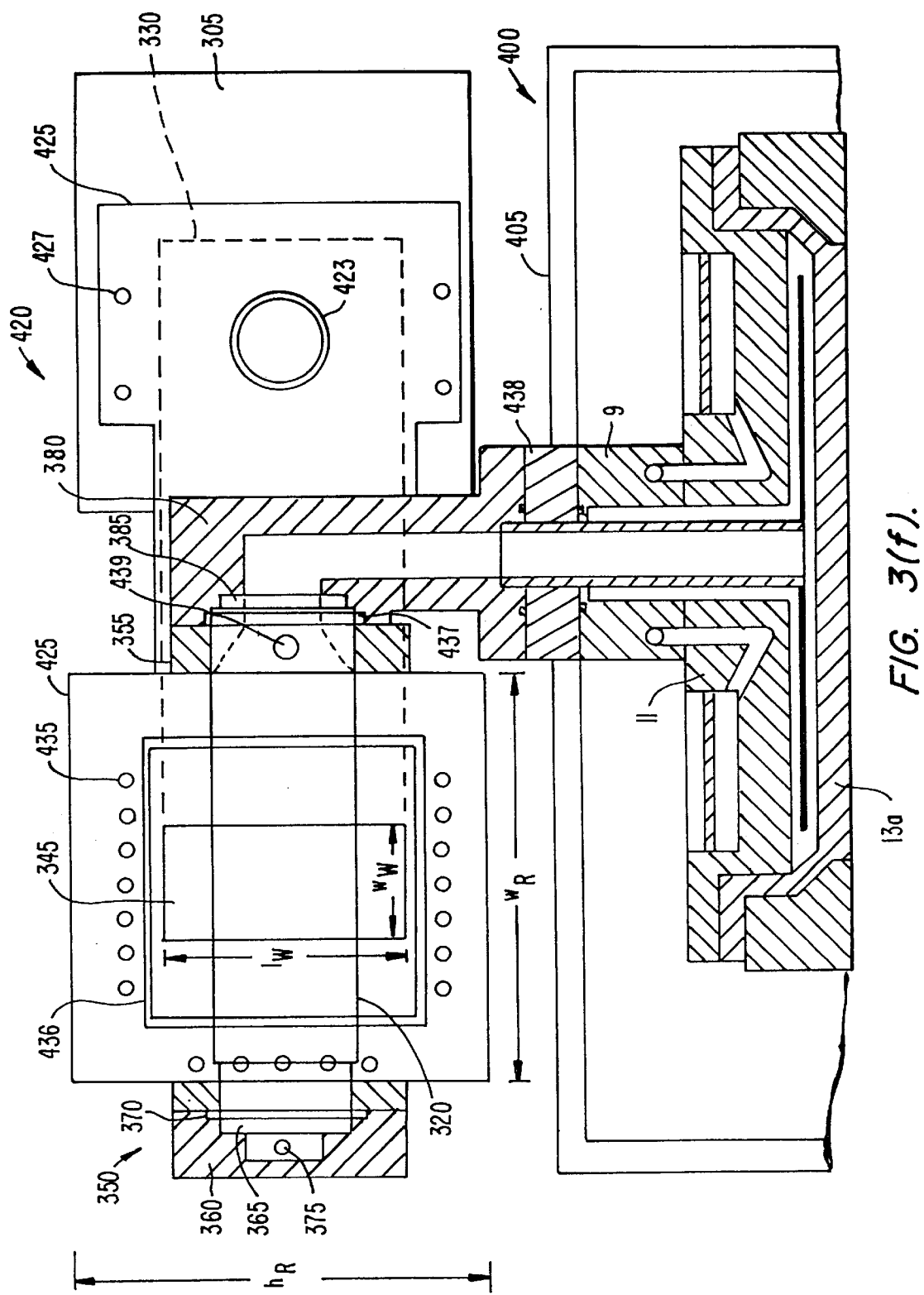

According to another specific embodiment of the present invention, FIGS. 3(e) and 3(f) are top and side views, respectively, of a remote microwave plasma source module 420 in relation with an exemplary chamber 400 for use therewith. More specifically, FIG. 3(f) is a side view, partly in cross-section, of module 420 along line A–A' of FIG. 3(e). Of course, portions of FIG. 3(f) shown in cross-section are taken through the centers of the respective portions in a plane parallel to the side view along line A–A'. As seen in FIG. 3(e), the overall physical dimensions (about 12 inches wide, about 12 inches long, and less than about 8 inches high) of module 420 according to the present embodiment also are compact and able to be packaged into an easily handled unit that may be attached to a processing chamber, as shown in FIGS. 3(e) and 3(f). Because of the physical configuration of the entire assembly, remote microwave plasma source module 420 also has similar advantages as discussed above for the embodiment of FIGS. 3(a)–3(b). For example, module 420 is able to use low cost, low wattage, pulsed microwave sources (providing about 1–1.5 kW microwave power) instead of the expensive, high power, CW microwave sources (providing about 2.5–6 kW microwave power), without sacrificing high microwave coupling efficiency. Also, air cooling of discharge tube 320 in module 420 is sufficient and extends the life span of discharge tube 320 as well as other metal components in module 420. As seen in FIG. 3(e), remote microwave plasma module 420 has a small footprint, allowing easy attachment onto the top of processing chamber 400 or other convenient location with minimal effort.

In general, remote module 420 has a similar configuration as the above discussed remote modules. More specifically, FIG. 3(e) shows the top view of a remote microwave plasma source module 420 which includes magnetron 305 coupled to waveguide system 310, resonator cavity 315 coupled to waveguide system 310 via window 345, plasma discharge tube 320 (dotted lines) disposed through and within resonator cavity 315, and an air-cooling path 325. Waveguide system 310 includes waveguide section 330 and tuning stubs 335 at points along the length ($l^W$) of waveguide section 330. A raised metal ring 423 of magnetron 305 couples microwaves to waveguide section 330 for use via window 345 in cavity 315. Discharge tube 320 includes an input end 365 coupled to gas feed line 375 for introduction of reactive gases, and an output end 385. Microwaves from magnetron 305 are transmitted via waveguide section 330 and through window 345 to cavity 315, where the reactive gases in tube 320 are energized to form a plasma therein. Radicals from the plasma exit tube 320 via output end 385 for use in the chamber.

In the present embodiment shown in FIGS. 3(e) and 3(f), waveguide section 330 generally is a section of rectangular cross-sectional waveguide. Constructed of a strong metal, such as copper, aluminum, stainless steel, or other conducting material, waveguide section 330 has a length sufficient to accommodate close proximity and modularity with the magnetron sources used and with resonator cavity 315. In remote module 420, waveguide section 330 has one wall that also acts as a mounting plate 425 to which magnetron 305 and resonator cavity 315 are securely mounted. The other three walls of waveguide section 330 are welded onto mounting plate 425 to form waveguide section 330. In the present embodiment, waveguide section 330 has a length ($l_{WG}$) of about 10 inches, a width ($W_{WG}$) of about 1.7 inches, and a height ($h_{WG}$) of about 3.4 inches. As seen in FIG. 3(e), mounting plate 425 is attached to the entire length of waveguide section 330 and exceeds the dimensions of waveguide section 330 in order to accommodate secure mounting of magnetron 305 and resonator cavity 315 thereon. The one wall of waveguide section 330 that acts as mounting plate 425 is attached to magnetron 305 via fasteners 427. Magnetron 305 is mounted onto plate 425 such that part of waveguide section 330 is coupled and closely adjacent via plate 425 to magnetron 305 at one end, where raised metal ring 420 of magnetron 305 provides the necessary electrical connection between magnetron 305 and waveguide section 330. Of course, mounting plate 425 has a hole substantially corresponding to the diameter of ring 423, which has a diameter of about 1.4 inches in a specific embodiment. Specifically, ring 423, which may be made of copper, aluminum or other conductive material, is secured to a wire mesh of magnetron 305.

In addition, waveguide system 310 of remote module 420 also includes an optimizing element 430, such as directional couplers or a phase detector to monitor the reflected microwaves and an isolator with load to absorb the reflected microwaves. Part of waveguide section 330 is coupled and adjacent via plate 425 to resonator cavity 315 at the other sloped end 433 (angled between about 35–55°, preferably about 45°). End 433 close to resonator cavity 315 provides improved microwave coupling from section 330 via window 345 to cavity 315. Alternatively, sloped end 433 may be replaced by a curved end. Of course, plate 425 of waveguide section 330 includes window 345 so that microwaves from waveguide section 330 pass through window 345 to resonator cavity 315, which is mounted to plate 425 via fasteners 435. In the present embodiment, window 345 has a width ($W_W$) of about 1.4 inches and a length ($l^W$) of about 3.4 inches, that is located substantially in the center of a wall of resonator cavity 315. Between mounting plate 425 and resonator cavity 315 is a microwave shielding gasket 436 that shields microwave energy from leaking out of cavity 315 via any cracks between waveguide section 330 and cavity 315. As seen in FIG. 3(f), plate 425 is shaped so as to provide stable mounting of waveguide section 330, magnetron 305, and resonator cavity 315 thereon with fasteners 427 and 435, which may be screws, bolts, or other conventional fastening elements, or epoxy. It is recognized that the specific shape of plate 425 may differ for other embodiments.

In module 420, discharge tube 320 is disposed through cavity 315 and is located such that, lengthwise, discharge tube 320 overlaps with a radiation pattern maximum, for example, the electric field (E-field) component of the microwaves resonating within cavity 315. According to the present embodiment, resonator cavity 315 is a single-mode cavity having a length ($l_R$) of about 5.9 inches, a width ($W_R$) of about 6 inches, and a height ($h_R$) of about 5.1 inches, with the dominant mode being the $TE_{102}$ mode of the microwaves having a frequency of about 2.45 GHz (assuming a "direction of propagation" along the axis of $l^R$ and perpendicular to the length of discharge tube 320). Resonator cavity 315 may be constructed of metal, such as copper, aluminum, stainless steel, or other conducting material. Discharge tube 320, a tube with circular cross-section and constructed of alumina, has an outer diameter of about 1.87 inches, an inner diameter of about 1.65 inches, and a length of about 6–8 inches, preferably about 7.8 inches, in the present embodiment. Further, the central axis along the length of discharge tube 320 is displaced by a distance (d) of about three quarter-wavelengths (of the microwave energy at the resonating frequency) or its optimized equivalent from window 345. In the present embodiment, d is about 4.08 inches.

As seen in FIGS. 3(e) and 3(f), the ends of discharge tube 320 are connected onto resonator cavity 315 by first mount assembly 350 and second mount assembly 355. First mount assembly 350 includes a housing 360 that contains and holds the input end 365 of discharge tube 320, which is fastened onto resonator cavity 315 by screws (alternatively, other fasteners or epoxies may be used) through corresponding holes in a wall of resonator cavity 315 and in assembly 350. Input end 365 has a sealing member 370, preferably an O-ring, about its outer diameter to prevent vacuum leaks from discharge tube 320. End 365 is an open, vacuum-sealed end that is gas-tight except for gas feed line 375 coupled to housing 360. Coupled to a clean feed manifold 445, gas feed line 375 introduces the reactive gases into discharge tube 320 where they may be energized by microwaves to form a plasma in discharge tube 320. Second mount assembly 355 contains and holds the other end 385 of discharge tube 320, which is fastened onto resonator cavity 315 by screws (alternatively, other fasteners or epoxies may be used) through corresponding holes in the opposite wall of resonator cavity 315 and in assembly 355.

Output end 385 of discharge tube 320 is open-ended and leads to outlet manifold 380, coupled via an RF isolator 438 to gas mixing block 9 of the processing chamber, as shown in FIG. 3(f). Made of metal such as aluminum, copper, nickel or stainless steel in various embodiments, outlet manifold 380 provides a conduit for radicals from discharge tube 320 of the remote module into the chamber via RF isolator 438. Additional features of outlet manifold 380 are further described below. In other embodiments, outlet manifold 380 may be internally lined with radical-resistant materials mentioned below in relation to isolator 438.

Figure 3I:
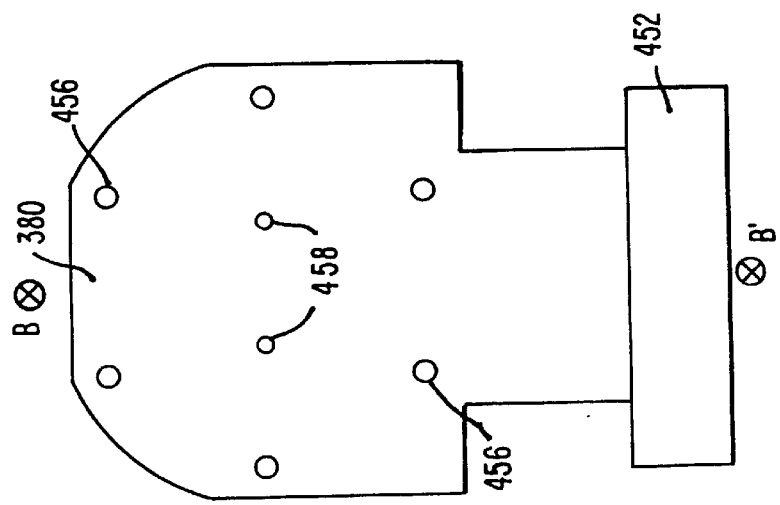
FIGS. 3(h) and 3(i) are front and back views of outlet manifold 380 in relation with line B–B' in FIG. 3(g), according to another specific embodiment.
Figure 3G:
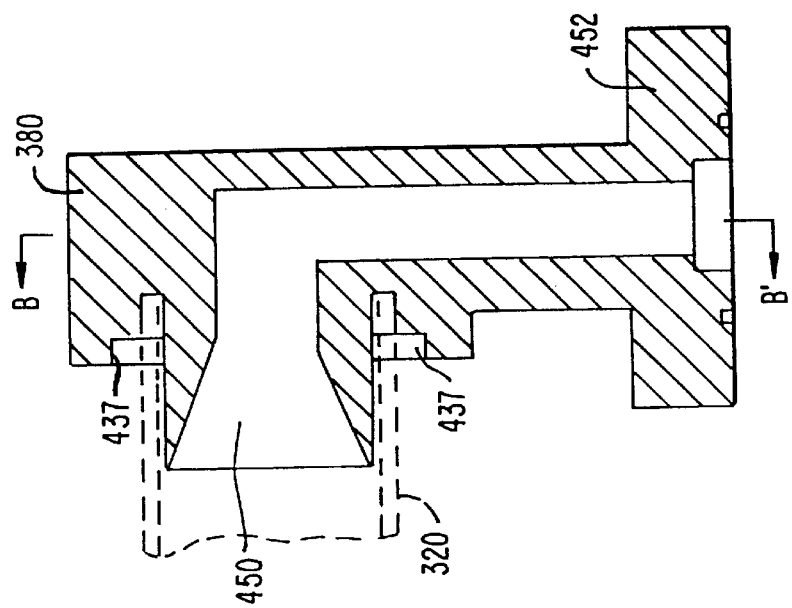
FIG. 3(g) is a side cross-sectional view of outlet manifold 380 of FIG. 3(f) shown in relation to end 385 of discharge tube 320, according to another specific embodiment.
Figure 3H:
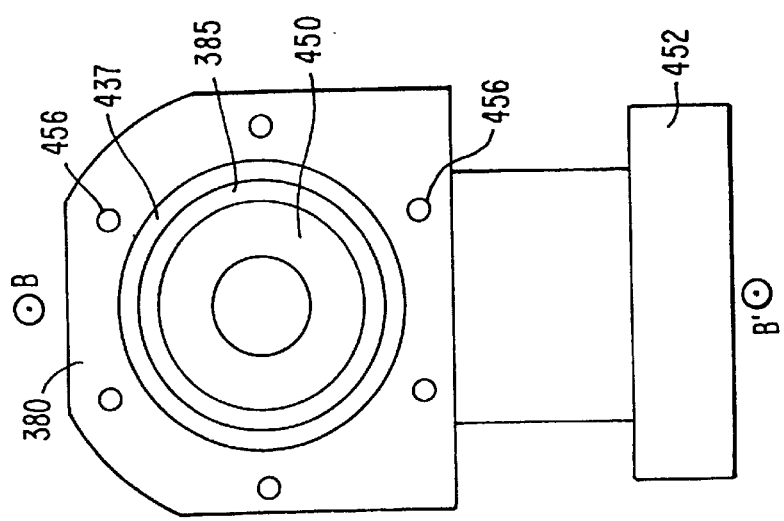

Outlet manifold 380 is shown in more detail in FIGS. 3(g)–3(i), in accordance with a specific embodiment. FIG. 3(g) is a side cross-sectional view of outlet manifold 380 of FIG. 3(f) shown in relation to end 385 of discharge tube 320 (shown in dotted line). FIGS. 3(h) and 3(i) are front and back views of outlet manifold 380 in relation with line B–B'. As seen in FIGS 3(g) and 3(h), outlet manifold 380 provides a conduit of passage having an input and an output. The conduit of output manifold 380 is preferably circular in cross-section or having other cross-sectional shape, and is approximately angled accommodate the relative locations of discharge tube 320 and the inlet into chamber 400. In the present embodiment, end 385 has a sealing member 437, preferably an O-ring, about its outer diameter to prevent leakage between tube 320 and outlet manifold 380. Outlet manifold 380 is appropriately counterbored to accommodate end 385 and sealing member 437. End 385 of discharge tube 385 and sealing member 437 are inserted into their respectively counterbored sections of input of outlet manifold 380 to provide a vacuum-sealed connection. When output end 385 is thus disposed in this counterbored input, a portion 450 of the input of outlet manifold 380 protrudes a certain distance into discharge tube 320. Close to end 385, the outer surface of this protruding portion 450 is suspended within the internal volume of discharge tube 320 along part of the length of discharge tube 320. Effectively acting as a heat sink to dissipate the heat generated at end 385 by radicals exiting tube 320, protruding portion 450 extends sufficiently into discharge tube 320 to draw heat convectively and radiatively from the internal volume of the gas within tube 320. Advantageously, protruding portion 450 of outlet manifold 380 provides cooling of end 385 of discharge tube 320 to further contribute to extending the life span of discharge tube 320, whose length is air cooled as discussed above. To provide a gradual transition from the inner diameter of discharge tube 320 to the diameter of the conduit provided in outlet manifold 380, protruding portion 450 is internally shaped like a funnel (radially sloped outwardly between about 25–50 degrees, preferably at about 30 degrees, from the horizontal) to direct radicals into the conduit. This funnel shape advantageously helps maintain a laminar flow of the radicals into the conduit such that turbulence and eddies are minimized. The larger opening of the funnel has a diameter (about 1.5 inches) slightly less than the inner diameter (about 1.65 inches) of discharge tube 320, the diameter at the smaller opening of the funnel is about 0.80 inches, and the vertical portion of the conduit in outlet manifold 380 has a diameter of about 0.67 inches, according to a specific embodiment.

As seen in FIGS. 3(f)–3(i), outlet manifold 380 also has an output having a flange 452 with through-holes (not shown) therein so that flange 452 and isolator 438 (which has corresponding through-holes, also not shown) may be connected to gas mixing block 9 by screws or bolts disposed through these through-holes. As seen in FIG. 3(g), the output of the conduit of outlet manifold 380 may have a counterbore 454 for alignment of an inlet tube passing through isolator 438 and lid 405 into gas mixing block 9. A sealing member around the inlet tube also may be used in the counterbored output of outlet manifold 380 to ensure a vacuum seal. Outlet manifold 380 also has multiple through-holes 456 disposed through its top section so that screws or bolts may be used to secure the input of outlet manifold 380 through corresponding through-holes in assembly 355 onto cavity 315 so that radicals exit tube 320 into outlet manifold 380.

Shown in FIG. 3(i), holes 458 on the back outer surface of outlet manifold 380 are provided for mounting a temperature interlock (not shown), such as a thermocouple with a safety switch connected to system controller 34, which can be programmed to automatically shut off the power supply to the magnetron(s) if the temperature of outlet manifold 380 approaches the threshold temperature for thermal cracking of tube 320. Optionally, a thermocouple 439 may be used to monitor the temperature of discharge tube 320 (due to plasma species exiting tube 320) so that the threshold temperature for thermal cracking of tube 320 is not exceeded.

RF isolator 438 isolates gas mixing block 9 (which is at an RF high) from outlet manifold 380, lid 405, and the body of the chamber (which are all grounded). RF isolator 438 preferably is made of a material that provides RF isolation, such as alumina or polytetrafluoroethylene (PTFE), and which is resistant to etching or deposition by radicals (such as fluorine radicals when forming the plasma using a fluorine-containing gas like $NF_3$). Such materials including PTFE (commercially available, for example, as Teflon™ PTFE) do not contribute to fluorine radical recombination inside the conduit provided by outlet manifold 380 during cleaning processes. In addition to PTFE, any fluorinated material including fluorinated polymers such as PFA (which is a polymer combining the carbon-fluorine flourine backbone of polytetrafluoroethylene resins with a perfluoroalkoxy side chain), fluorinated ethylene-propylene (TFE), or the like, also may be used. Of course, other materials may be used that are resistant to the particular reactive chemistry used.

As discussed above, processing chamber 400 shown in FIGS. 3(e)–3(f) is an exemplary processing chamber upon which module 420 may be seated and attached for use therewith. Processing chamber 400 has a relatively flat top surface or lid 405 which has a broad area and polygonal shape, as is typical with many CVD processing chambers. In the specific embodiment, lid 405 and chamber 400 taper into a reduced area 410 (shown, for example, in FIGS. 3(b) and 3(f)) which is proximate to the throttle valve and gas exit. Lid 405 of processing chamber 400 may be equipped with a coolant inlet manifold 440, inlet 415 (shown in dotted line in FIG. 3(e)), and clean gas feed manifold 445. According to the present embodiments, coolant inlet manifold 440 allows cooling fluids input at an inlet of manifold 440 to enter coolant passages within lid 405. Clean gas feed manifold 445 is made of stainless steel, aluminum, copper, or other metal in some embodiments. In other embodiments, clean gas feed manifold 445 may made of radical-resistant material similar as those mentioned above for isolator 438.

According to the present embodiment, remote module 420 shown in FIGS. 3(e)–3(f) provides radicals from the plasma formed in discharge tube 320 into gas mixing block 9 via outlet manifold 380 and isolator 438 for introduction via gas distribution plate 13a into processing chamber 400, in contrast to the embodiment shown in FIG. 3(b) which provides radicals via inlet 415 to gas passages (in arm 8) to gas mixing block 9. As mentioned above, inlet 415 (shown in dotted line) is accessible either by a top end or a bottom end through which gases may be introduced into processing chamber 400 by passing through gas passages (in arm 8 of FIG. 1(a) and FIG. 1(d)) to the gas mixing block and then through gas distribution plate 13. In the embodiment of FIGS. 3(e)–3(f), inlet 415 is used to provide reactive gases into clean gas feed manifold 445 for introduction into discharge tube 320 to form a plasma containing radicals. Specifically, the reactive gases are sent via the opened top end of inlet 415 into clean gas feed manifold 445 for introduction into discharge tube 320. Gas passages (in arm 8 of FIG. 1(a) and FIG. 1(d)) coupled to inlet 415 may be kept closed (for example, using gate valves that may be selectively opened and closed) if it is desired to send reactive gases only to remote module 420. However, the gas passages of inlet 415 may be kept open so that reactive gases are sent not only to remote module 420 but also to chamber 400. When kept open, gas passages also receive reactive gases for introduction to gas mixing block 9 and gas distribution plate 13a into the vacuum chamber. Normally, deposition gases enter inlet 415 (from its bottom end while its top end is closed) for introduction into gas passages to the gas mixing block. In the embodiment shown in FIG. 3(e), reactive gases used for cleaning may selectively be allowed to enter clean gas feed manifold 445 by opening the top end of inlet 415. Cleaning gases input through the bottom end of inlet 415 can then pass through clean manifold 445 into gas feed line 375 and to discharge tube 320 of remote module 420. These gases are thus introduced into discharge tube 320 where a plasma may be formed, and radicals from the microwave-generated plasma are introduced from tube 320 to outlet manifold 380 (and isolator 438) into gas mixing block 9, where the radicals then enter chamber 400 via gas distribution plate 13a. In alternative embodiments, inlet 415 may provide a passage for clean gases to be sent to clean gas feed manifold 445 and a separate passage for deposition gases to be sent to gas passages (in arm 8), rather than the embodiments described above.

The embodiment shown in FIGS. 3(e)–3(f) permits dual entry of gases and radicals into chamber 400 (by keeping the gas passages coupled to inlet 415 opened). Dual entry of gases and radicals may be desired in some applications, while single entry of clean gases into remote module 420 for introducing only radicals into chamber 400 also may be desired in other applications. Of course, entry of process gases via inlet 415 and/or via remote module 420 also may be desired in other applications, in accordance with other embodiments where remote module 420 is also used for deposition. For cleaning applications, residues in processing chamber 400 between gas mixing block 9 and the gas exhaust manifold are cleaned by the radicals from the attached remote microwave plasma source module 300. From processing chamber 400, an exhaust system then exhausts the residue and gases via ports into a vacuum manifold and out an exhaust line by a vacuum pump system. The pressure at which the gases and residue are released through the exhaust line is controlled by a throttle valve and pumping system.

Figure 4A:
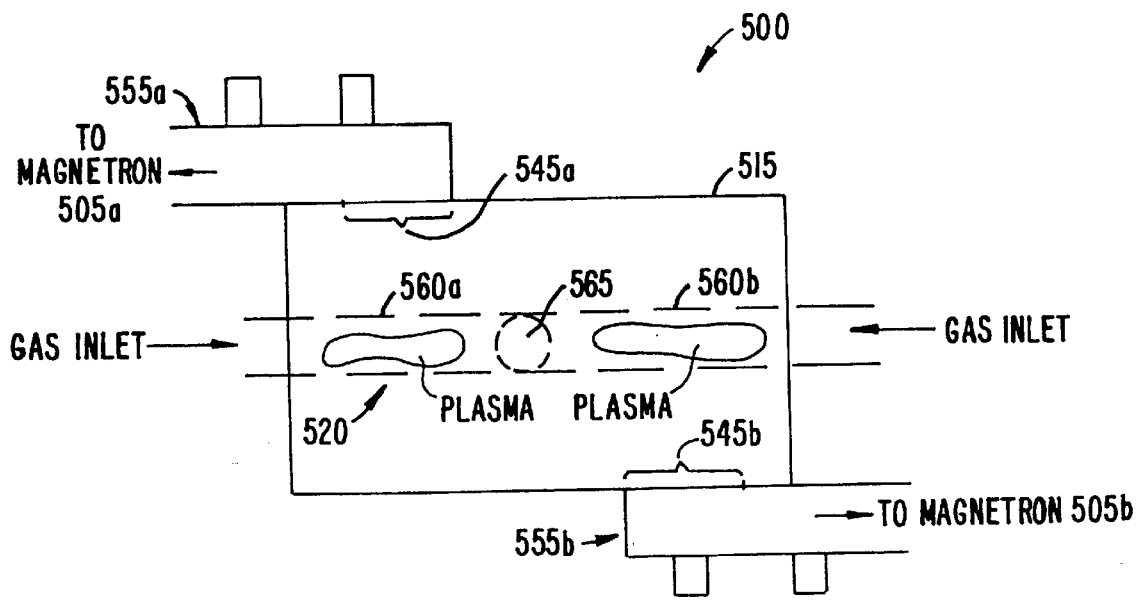
FIGS. 4(a) and 4(b) illustrate simplified top and side views, respectively, of yet another embodiment of a remote microwave plasma source module 500 of the present invention.
Figure 4B:
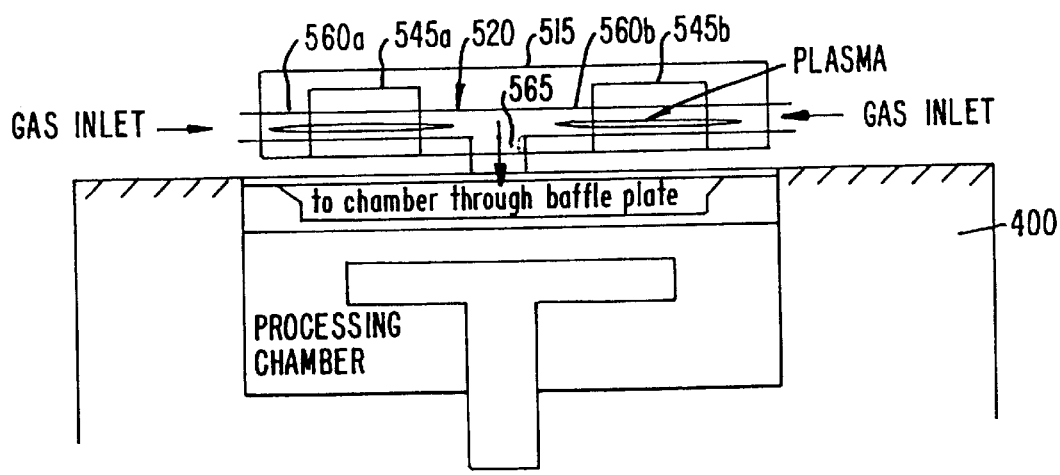

FIGS. 4(a) and 4(b) illustrate simplified top and side views of yet another embodiment of a remote microwave plasma source module 500 of the present invention. According to the present embodiment of FIGS. 4(a) and 4(b), remote microwave plasma source module 500 includes two magnetrons 505a and 505b (not shown); a resonator cavity 515; a T-shaped discharge tube 520 within resonator cavity 515; two openings or windows 545a and 545b in resonator cavity 515; and two waveguide systems 555a and 555b, one for each window 545a and 545b and leading to a respective magnetron 505a and 505b. For simplicity, FIG. 4(b) shows only windows 545a and 545b of the complete waveguide systems 555a and 555b. A forced air cooling system also may be used with the present embodiment. The configuration and description of each magnetron 505 with its respective waveguide system 555 and window 545 are similar to that described above for the embodiment of FIG. 3(a). Constructed from alumina, discharge tube 520 has two horizontal branches 560a and 560b which join at a vertical stem 565, which acts as a central exhaust port. Reactive gases are input to the outer ends of each branch 560 of discharge tube 520. Then, reactive gases in branches 560a and 560b are energized by microwave radiation directed through respective windows 545a and 545b via respective waveguide systems 555a and 555b from magnetrons 505a and 505b. Plasma is thereby formed in branches 560a and 560b of discharge tube 520. Radicals from plasmas formed in branches 560a and 560b then exit discharge tube 520 via stem 560. Radicals output from stem 560 are fed into a processing chamber 400 through its distribution manifold. The short length of the feed between stem 560 and processing chamber 400 reduces radical recombination. Radicals flow from remote module 500 into the attached CVD apparatus where residues and gases are exhausted. From the attached CVD apparatus, an exhaust system exhausts the residue and gases via ports into a vacuum manifold and out an exhaust line by a vacuum pump system. The pressure at which the gases and residue are released through the exhaust line is controlled by a throttle valve and pumping system.

Use of multiple intermittently-pulsed magnetrons ionizes the gases multiple times to enhance total ionization and radical formation. That is, the same differential volume of gas in a discharge tube will be energized by microwaves from multiple magnetrons for an increased amount of microwave energy applied to the discharge tube in a given time. For a given low gas flow into the discharge tube, multiple pulsed magnetrons (each providing low microwave power) may be used to achieve a certain level of ionization and radical formation. For a higher gas flow into the discharge tube, multiple more frequently-pulsed magnetrons each providing the same low microwave power may be used to achieve this level of ionization and radical formation. By way of example, a multiple magnetron system may use two magnetrons, as discussed below. In dual magnetron embodiments including the exemplary embodiment of FIGS. 4(a) and 4(b), the two magnetron sources can be alternately powered so that microwaves are constantly pulsed at about 120 Hz. As shown in FIG. 5(a), each magnetron 505a and 505b produces microwaves (at about 2.45 GHz) in a pulsed (about 60 Hz) manner using each respective pulsed power supply. By delaying the pulse of one magnetron 505b by a phase difference of about 180 degrees in relation to the other magnetron 505a, as shown in FIG. 5(b), the two pulsed power supplies for the magnetrons are able to provide microwaves constantly pulsed at about 120 Hz, as seen in FIG. 5(c). In FIG. 5(c), a first cycle of the waveform ($M_A$) is generated by magnetron 505a and a second cycle ($M_B$) is generated by magnetron 505b. For about 700 standard cubic centimeters (sccm) $NF_3$ gas flow into the discharge tube with a pressure therein less than about 3 torr for a chamber pressure less than about 1.2 torr, about 1.5 kW total microwave power generated by the magnetrons (each powered magnetron providing about 750 W microwave power) can produce a gas breakdown efficiency of about 99%. Thus, such dual magnetrons powered by alternately pulsed power supplies results in a higher cleaning efficiency than capacitively coupled electrodes, which typically produce a gas breakdown efficiency of between about 15–30%. Further, with the use of the low wattage, pulsed power supplies for the magnetrons, less heat is generated at discharge tube 520 and air-cooling is sufficient to dissipate the heat at discharge tube 520, as discussed above. Of course, the magnetron(s) in various embodiments may require liquid or air cooling.

Figure 6A:
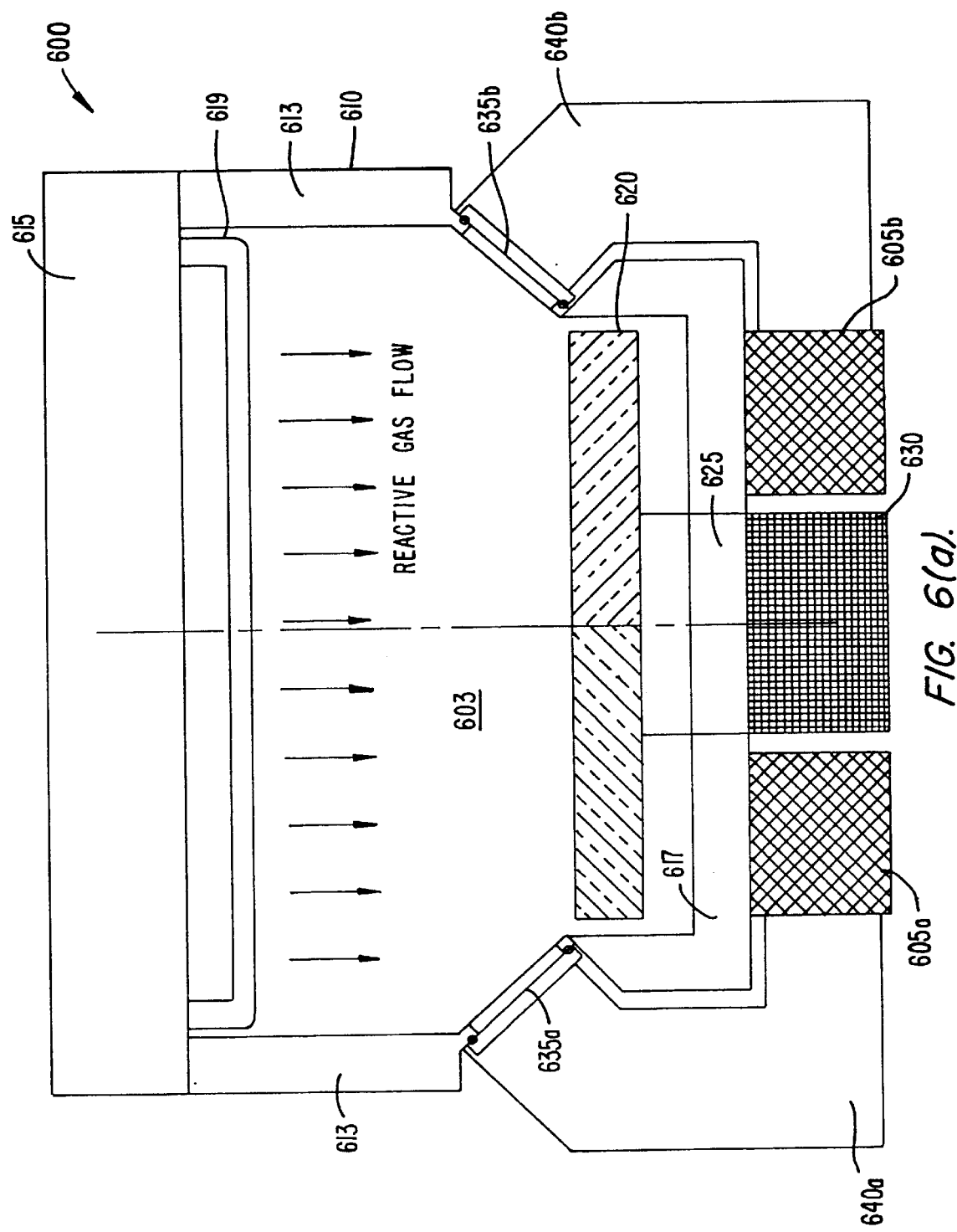
FIGS. 6(a) and 6(b) are simplified diagrams illustrating other specific embodiments of the present invention which provide new upgraded CVD apparatus or retrofitted existing CVD apparatus 600.
Figure 6B:
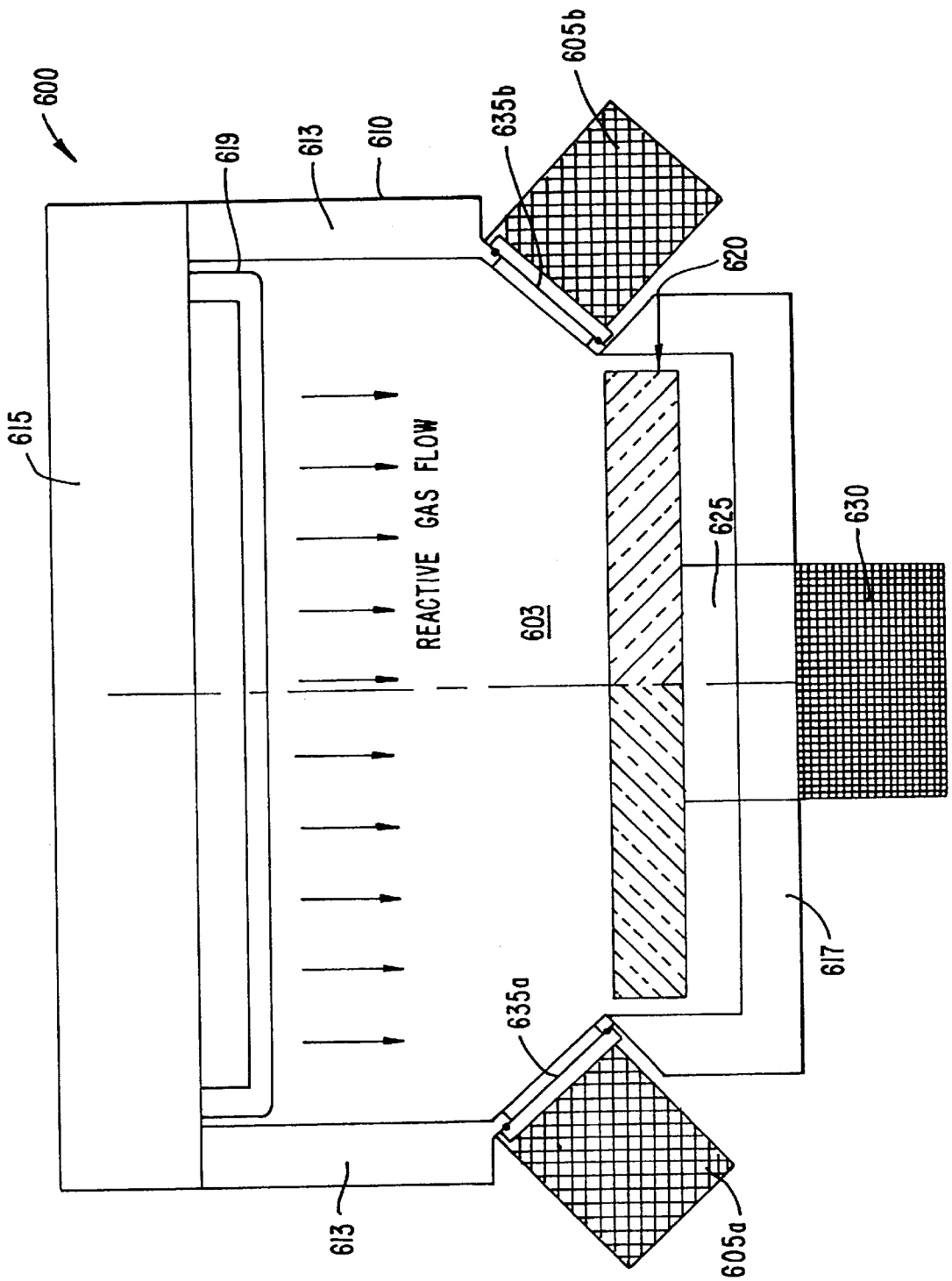

FIGS. 6(a) and 6(b) are simplified vertical cross-sectional views illustrating other specific embodiments of the present invention which provide new upgraded CVD apparatus or retrofitted existing CVD apparatus. The present embodiments are actually integral to CVD apparatus to provide a microwave plasma source for upgraded capabilities.

Specifically, FIG. 6(a) illustrates an upgraded/retrofitted CVD apparatus 600 having a chamber 603 that utilizes two magnetron sources 605a and 605b, in accordance with another specific embodiment of the present invention. Of course, it should be recognized that other embodiments may use only a single magnetron source or may use more than two magnetron sources. As seen in FIG. 6(a), CVD apparatus 600 includes a chamber body 610 having walls 613 and a top cover 615 and a base 617; and a gas distribution manifold 619 for dispersing reactive gases through perforated holes in manifold 619 to a wafer or substrate (not shown) that rests on a resistively-heated pedestal 620. Pedestal 620 is highly thermally responsive and is mounted on a support 625 so that pedestal 620 (and, if present, the substrate supported on the upper surface of pedestal 620) can be controllably moved by a lift mechanism 630 between a lower loading/off-loading position and an upper processing position which is adjacent to manifold 619.

As seen in FIG. 6(a) near the juncture between walls 613 and base 617, CVD apparatus 600 may be equipped with or retrofitted with dielectric windows 635a and 635b, preferably made of alumina in ceramic or sapphire form. For example, an existing CVD apparatus may be machined to provide windows and dielectric windows fitted thereon. Dielectric windows 635a and 635b also may be made of other materials which are relatively transparent to microwaves and resistant to etching by radicals formed in a plasma within chamber 603.

Magnetrons 605a and 605b are coupled, respectively, to waveguides 640a and 640b which connect, respectively, to dielectric windows 635a and 635b. Microwave energy from magnetrons 605a and 605b is directed by waveguides 640a and 640b through dielectric windows 635a and 635b to chamber 603. Waveguides 640a and 640b are primarily used to provide convenient placement or location of magnetrons 605a and 605b, as well as directing microwave energy therefrom. In alternative embodiments, waveguides 640a and 640b may be omitted and magnetrons 605a and 605b may be placed proximate to dielectric windows 635a and 635b, as shown in FIG. 6(b). Further, combinations of a first magnetron with a waveguide and a second magnetron without a waveguide also may be used depending on space constraints in CVD apparatus 600. Magnetrons 605a and 605b are each low cost microwave magnetrons radiating microwaves of about 2.45 GHz and having a low wattage, pulsed power supply operating at about 60 Hz. Preferably, magnetrons 605a and 605b are alternately pulsed to provide constant pulsed microwaves at about 120 Hz, as discussed above for FIGS. 5(a)–5(c).

Of course, CVD apparatus 600 also includes other elements such as gas supply lines, gas mixing system, mass flow controllers/valves, etc. that are not discussed or shown here since they have already been discussed above for exemplary CVD system 10 of FIGS. 1(a)–1(f). Reactive gases, supplied through the gas supply lines having mass flow controllers into the gas mixing system, are sent to manifold 619. According to the specific embodiments of FIGS. 6(a) and 6(b), reactive gases supplied to manifold 619 are vented generally and uniformly toward pedestal 620 and ionized by microwave energy radiating through dielectric windows 635a and 635b from magnetrons 605a and 605b. As the reactive gas is ionized after distribution into chamber 603, the possibility of ion recombination on passage through faceplate 619 is avoided in the present embodiments using magnetrons. That is, the plasma created by magnetron sources with the present invention creates ions that have a purely chemical effect. However, other CVD systems that use voltage or potential differences in creating a biased plasma experience extensive ion damage from physical sputtering effects to various parts of the chamber over time. In particular, the potential difference causes ions in the plasma to be accelerated toward and attack, for example, the chamber walls. The present invention operates without application of a potential difference and provides ions having a chemical nature without any such sputtering effects. The present invention therefore causes less ion damage to various parts of the chamber than these other CVD systems.

In the present embodiments, the volume of chamber 603 acts as a resonating cavity for the microwaves from magnetrons 605a and 605b. In general, chamber 603 is about 14 inches wide, about 19 inches long, and about 7 inches high when pedestal 620 is in its lowest position. Such chamber volume 603 is generally suitable for resonance at about 2.45 GHz. However, tuning of resonance chamber volume 603 may be accomplished by adjusting portions of CVD apparatus 600. According to a specific embodiment, the variable spacing between faceplate 619 and pedestal 620 is used to tune the chamber/cavity 603 for resonance. The efficiency of ionization and radical formation can be substantially increased by achieving the resonant volume between faceplate 619 and pedestal 620 of chamber 613. The movement of pedestal 620 may then tune chamber/cavity 603 to adjust for impedance changes before and after ignition of plasma by the microwaves. In particular, pedestal 620 may be moved relative to faceplate 619 into a first position which defines the resonant volume for ignition of the plasma. Pedestal 620 may then be adjusted relative to faceplate 619 into a second position which tunes the resonant volume to compensate for the impedance change after the plasma is struck. Alternatively, tuning of resonance chamber volume 603 also may be accomplished by providing moveable chamber walls 613. The variable spacing between chamber walls 613 is used to tune the chamber/cavity 603 for resonance. The efficiency of ionization and radical formation also can be substantially increased by achieving the resonant volume between chamber walls 613. Adjustment of the spacing between chamber walls 613 also may be achieved for both pre- and post-plasma ignition resonance positions to compensate for impedance changes.

Due to the high efficiency of gas ionization by microwave sources, a low-pressure or a low-flow regime may be used to avoid localization of plasma in chamber 603. Unlike the other embodiments discussed above, which use a discharge tube in a remote microwave plasma source, the present embodiment dispenses with use of a discharge tube and instead requires dielectric windows mounted on chamber body 610. Accordingly, chamber 603 is used as a combined resonance cavity and plasma applicator. Further, walls 613 are temperature controlled and maintained at a temperature of about 80° C. Chamber walls 613 therefore provide good heat dissipation for dielectric windows 635a and 635b, thereby eliminating the need for active cooling (air or liquid) of the dielectric windows. An exhaust system incorporating a vacuum pump system then exhausts the residue and gases via ports into a vacuum manifold and out an exhaust line. The pressure at which the gases and residue are released through the exhaust line is controlled by a throttle valve and the pumping system.

The above embodiments of the present invention are useful in cleaning CVD apparatus or other apparatus. The usefulness of the present invention is demonstrated for cleaning of CVD apparatus using $NF_3$ as an exemplary reactive gas. However, other reactive gases such as $CF_4$, and $ClF_3$ also may be used.

The following discussion for the remote module 300, 420 or 500 (FIGS. 3 and 4) of the present invention is described in relation to a processing chamber similar to CVD system 10 discussed for FIG. 1(*a*)–(*f*), but the present invention also may be used with other CVD systems or other apparatus. To clean the processing chamber, controller 34 controls the appropriate motors of the robotized arm to unload from pedestal 12 any wafer that has been processed in the processing chamber. Pedestal 12 is then moved to its lowest non-processing position from gas distribution manifold 11, which may be about 999 mil in a specific embodiment, to ensure optimal cleaning of the chamber by radicals from the upstream plasma formed in remote module 300, 420 or 500. Once pedestal 12 is properly positioned, system controller 34 maintains heated pedestal 12 preferably at a temperature of between about 300–500° C., most preferably to about 400° C. These temperature ranges are maintained throughout the cleaning procedure. The processing chamber is maintained at a pressure less than about 1.5 torr preferably within a range of about 50 millitorr to about 1.5 torr, most preferably about 0.7–1.2 torr in some embodiments. The pressure within the discharge tube is less than about 3 torr, about 1.5–3 torr in some embodiments, in order to strike a plasma. The reactive gas $NF_3$ is then introduced via inlet 415 into clean gas manifold 445 to input feed 375 into discharge tube 320 of remote module 300 or into inlets to discharge tubes 520 of remote module 500, where microwaves ionize the $NF_3$. The flow rate of $NF_3$ is preferably between about 400–1000 standard cubic centimeters per minute (sccm), most preferably about 700 sccm. The rate at which the reactant gas is introduced into the discharge tube(s) may be controlled by system controller 34 of CVD system 10 through a valve or mass flow controller in the gas feed line 375 or inlets. Optionally, the $NF_3$ also may flow from inlet 415 through gas passages into the gas mixing block for introduction into the chamber. The reactant gas initially may flow without application of power to the magnetron(s) to provide gas flow stabilization. This gas flow stabilization may last about 5 seconds in a specific embodiment before powering the magnetron(s). Then, fluorine radicals (and, optionally, also $NF_3$) from the plasma created in the remote module flow downstream through manifold 11 of the processing chamber and efficiently clean the residues in the processing chamber. The selected processing chamber pressure is set and maintained throughout deposition by a throttle valve in conjunction with the vacuum pump system. The throttle valve and the vacuum pump system are all controlled by system controller 34 in setting and maintaining the selected pressure. After being set, processing conditions are maintained by system controller 34 for a selected time period, preferably between about 40–80 seconds, and most preferably between about 50–65 seconds, for the entire cleaning procedure. Once magnetron(s) are powered down after the cleaning is complete, the pressure may be allowed to stabilize for about 5 seconds before bringing the pressure to the desired level for the subsequent process step to occur in the chamber. For about 700 sccm $NF_3$ gas flow into the discharge tube with a pressure therein less than about 3 torr at a chamber pressure less than about 1.2 torr, about 1.5 kW microwave power generated by the magnetron can produce a gas breakdown efficiency of about 99%.

The following discussion for upgraded/retrofitted CVD apparatus 600 of the present invention is described in relation to a processing chamber like CVD system 10 discussed for FIG. 1(*a*)–1(*f*), but the present invention also may be used with other CVD systems. To clean CVD apparatus 600, system controller 34 controls the appropriate motors of the robotized arm to unload from pedestal 620 any wafer that has been processed in the processing chamber 603. Pedestal 620 is then moved into its lowest non-processing position, which is about 999 mil from gas distribution manifold 619 to ensure optimal cleaning by fluorine radicals from the plasma formed in situ in chamber 603. Once pedestal 620 is properly positioned, controller 34 maintains heated pedestal 620 preferably at a temperature of between about 350–450° C., most preferably to about 400° C. These temperature ranges are maintained throughout the cleaning procedure. Processing chamber 603 is maintained at a pressure preferably within a range of about 50 millitorr to about 1.5 torr. Pressure stabilization steps also may be performed. The reactive gas $NF_3$ is then introduced through a gas supply line to gas manifold 619 into resonance chamber 603, where microwaves from the magnetrons efficiently ionize the $NF_3$. The flow rate of $NF_3$ is preferably between about 400–800 sccm, most preferably about 600 sccm. The rate at which the reactant gas is introduced into processing chamber 603 may be controlled by controller 34 of CVD system 10 through a valve or mass flow controller in the gas supply line. Fluorine radicals from the microwave plasma efficiently clean the residues throughout processing chamber 603. In other embodiments, other gases containing fluorine may be introduced into resonance chamber 603. System controller 34 also controls lift mechanism 630 which adjusts the position of pedestal 620 to tune for pre- and post-plasma ignition resonance. The selected pressure in resonance chamber 603 is set and maintained throughout cleaning by a throttle valve in conjunction with the vacuum pump system and the introduction of the reactive gas. The throttle valve and the vacuum pump system are all controlled by controller 34 in setting and maintaining the selected pressure. After being set, processing conditions are maintained by controller 34 for a selected time period to efficiently clean the CVD system.

In addition to providing upgraded capability of cleaning procedures, the embodiments of FIGS. 6(*a*) and 6(*b*) also are capable of being used for deposition and etching as required for other process steps in an in situ manner, thereby saving time and providing other advantages. It is seen that these embodiments also may be used to etch or deposit a wafer or substrate using an integral microwave plasma source without having to attach a remote module to processing chamber 603. Moreover, even if a remote module is attached to processing chamber 603, the procedure for removal of the remote module from processing chamber 603 may be easily accomplished by simply detaching and removing the remote module from the lid of processing chamber 603. Therefore, maintenance cleaning of processing chamber 603 involves either opening the unencumbered lid or easily removing the remote module to then open the lid, resulting in less wasted time.

The above-described gas flow, chamber pressure and temperature ranges provide for cleaning procedures that are sufficient to remove undesired oxide and nitride residues that may be built up over time after processing multiple wafers or substrates. The parameters in the above processes should not be considered limiting to the claims. The actual values (temperature, pressure, gas flows, etc.) selected for a particular cleaning recipe will vary according to various applications. Also, flow values mentioned above are for a DxZ chamber (equipped for a 200-mm wafer and with a total volume of about 5 liters) manufactured by Applied Materials, but flow values would differ depending on the type or size of chamber used. For example, a multimode chamber would require different flow values. In addition, flow valves described above are for an applicator tube with dimensions according to the specific embodiments and may differ for applicator tubes with other dimensions. One of ordinary skill in the art may also use other chemicals, chamber parameters, and conditions for cleaning with the present invention.

It is to be understood that the above description is intended to be illustrative and not restrictive. Many embodiments will be apparent to those of skill in the art upon reviewing the above description. By way of example, the inventions herein have been illustrated primarily with regard to a cleaning apparatus, but they are not so limited. Those skilled in the art will recognize other equivalent or alternative methods of depositing the dielectric layer while remaining within the scope of the claims of the present invention. Although the above description discusses $NF_3$ in particular, other reactive gases including dilute $F_2$, $CF_4$, $C_2F_6$, $C_3F_8$, $SF_6$, or $ClF_3$ may be used for cleaning substrate processing systems used to deposit silicon oxides. Alternatively, deposition or etching gases may be used for embodiments where the microwave plasma system is used for deposition or etching. In addition to being used with CVD chambers, the remote plasma modules described above may be used with etch chambers, physical vapor deposition (PVD) chambers, or other chambers. Further, although specific dimensions for various portions of the apparatus have been described according to specific embodiments, some specific dimensions are exemplary and other dimensions may be used for other embodiments. The scope of the inventions should, therefore, be determined not with reference to the above description, but should instead be determined with reference to the appended claims, along with the full scope of equivalents to which such claims are entitled.

What is claimed is:

1. A method of operating a substrate processing system, said method comprising:
    flowing a reactive gas into a processing chamber as part of a chamber clean operation, wherein said chamber clean operation includes first and second stages, said first stage including a time period prior to ignition of a plasma in said processing chamber and said second stage including a time period after ignition of said plasma and prior to extinguishing said plasma;
    directing microwave energy into said processing chamber during said first and second time periods; and
    during said first stage of said chamber cleaning operation, adjusting a moveable portion of said processing chamber to a first position resulting in resonance of said microwaves in said processing chamber and during said second stage of said chamber cleaning operation, adjusting said moveable portion of said processing chamber to a second position resulting in resonance of said microwaves in said processing chamber during said second stage.

2. The method of claim 1 wherein said moveable portion is a substrate support.

3. The method of claim 1 wherein said moveable portion is a wall of said processing chamber.

4. The method of claim 1 wherein said reactive gas comprises fluorine.

5. The method of claim 1 wherein said processing chamber includes a second dielectric window and said microwave producing system further comprises a second magnetron coupled to said second dielectric window, and wherein said first and second magnetrons direct pulsed, low wattage microwave energy through said first and second dielectric windows respectively to said processing chamber.

6. The method of claim 5 wherein directing microwave energy into said processing chamber comprises directing pulsed, low wattage microwave energy from said first and second magnetrons alternately into said processing chamber.

7. The method of claim 5, wherein said pulsed, low wattage microwave energy is about 1–1.5 kilowatts pulsed at about 60 Hz.

8. A substrate processing system comprising:
    a processing chamber, said processing chamber acting as a resonant cavity, a dielectric window in said resonant cavity, and a moveable portion, wherein a position of said moveable portion of said resonant cavity may be adjusted to tune said processing chamber for resonance;
    a gas delivery system configured to deliver one or more gases to said processing chamber;
    a microwave producing system coupled to said dielectric window, said microwave producing system capable of directing microwave energy through said dielectric window to said processing chamber;
    a controller configured to control said gas delivery system, said moveable portion and said microwave producing system; and
    a computer-readable memory, coupled to said controller, said computer-readable memory having a computer-readable program embodied therein for directing operation of said substrate processing system, said computer-readable program including:
        computer instructions for controlling said gas delivery system to introduce a reactive gas into said processing chamber as part of a chamber clean operation apparatus, wherein said chamber clean operation includes first and second stages, said first stage including a time period prior to ignition of a plasma in said processing chamber and said second stage including a time period after ignition of said plasma and prior to extinguishing said plasma;
        computer instructions for controlling said microwave producing system to direct said microwave energy into said processing chamber during said first and second time periods; and
        computer instructions for adjusting said moveable portion of said processing chamber to a first position resulting in resonance of said microwaves in said processing chamber during said first stage and to a second position, said second position resulting in resonance of said microwaves in said processing chamber during said second stage.

9. The apparatus of claim 8 wherein said moveable portion comprises a substrate support.

10. The apparatus of claim 8 wherein said moveable portion comprises a wall of said processing chamber.

11. The apparatus of claim 8 wherein said reactive gas comprises fluorine.

12. The apparatus for claim 8 wherein said microwave producing system comprises a magnetron capable of directing pulsed, low wattage microwave energy through said dielectric window.

13. The apparatus of claim 12 wherein said processing chamber includes a second dielectric window, and wherein said microwave producing system further comprises a second magnetron coupled to said second dielectric window, said second magnetron directing pulsed, low wattage microwave energy through said second dielectric window to said processing chamber.

14. The apparatus of claim 13 wherein said pulsed, low wattage microwave energy is about 1–1.5 kilowatts pulsed at about 60 Hz.

15. The apparatus of claim 13 wherein said computer instructions that control said microwave producing system control said system to direct said pulsed, low wattage microwave energy from said first and second magnetrons alternately into said processing chamber.

16. The apparatus of claim 8 wherein said processing chamber can be tuned for a selected mode of resonating frequency at about 2.4 GHz.

17. The apparatus of claim 16 wherein said pulsed, low wattage microwave energy is about 1–1.5 kilowatts pulsed at about 60 Hz.

18. A substrate processing reactor system comprising:
 a processing chamber, said processing chamber acting as a resonant cavity, a first dielectric window in said resonant cavity, and a moveable portion, wherein a position of said moveable portion of said resonant cavity may be adjusted to tune said processing chamber for resonance;
 a gas delivery system configured to deliver a reactive gas to said processing chamber;
 a heating system including a pedestal for heating to a selected temperature;
 a vacuum system configured to set and maintain a selected pressure within said processing chamber;
 a microwave producing system, said microwave producing system comprising a first magnetron coupled to said first dielectric window, said first magnetron directing pulsed, low wattage microwave energy through said first dielectric window to said processing chamber;
 a controller configured to control said gas delivery system, said heating system, said microwave producing system, and said vacuum system; and
 a memory, coupled to said controller, comprising a computer-readable medium having a computer-readable program embodied therein for directing operation of said substrate processing system, said computer-readable program including:
  a first set of computer instructions for controlling said gas delivery system to introduce said reactive gas for cleaning said substrate processing apparatus, during a first and a second time periods into said processing chamber at a first flow rate, wherein said first set of computer instructions includes:
 a first subset of computer instructions for controlling said vacuum system to maintain a pressure of less than about 1.5 torr within said processing chamber during said first and second time periods; and
 a second subset of computer instructions for controlling said heating system to maintain said pedestal at a temperature of between about 350–450° C. during said first and second time periods;
 a third subset of computer instructions for controlling said microwave producing system to direct said pulsed, low wattage microwave energy into said processing chamber during said first and second time periods;
 a fourth subset of computer instructions for adjusting said moveable portion of said processing chamber to a first position, said first position resulting in resonance of said microwaves in said processing chamber during said first time period.

19. The apparatus of claim 18 wherein said first set of computer instructions also includes a fifth subset of computer instructions for adjusting said moveable portion of said processing chamber from said first position to a second position, said second position resulting in resonance of said microwaves in said processing chamber during said second time period, wherein said first time period is prior to ignition of a plasma from said reactive gas energized by said microwaves and said second time period is after ignition of said plasma.

20. The apparatus of claim 18 wherein said moveable portion of said processing chamber comprises said pedestal.

21. The apparatus of claim 18 wherein said moveable portion of said processing chamber comprises a wall of said processing chamber.

22. The apparatus of claim 18 wherein said reactive gas includes fluorine.

23. The apparatus of claim 18 wherein said processing chamber includes a second dielectric window, and wherein said microwave producing system further comprises a second magnetron coupled to said second dielectric window, said second magnetron directing pulsed, low wattage microwave energy through said second dielectric window to said processing chamber; and wherein said third set of computer instructions controls said microwave producing system to direct said pulsed, low wattage microwave energy from said first and second magnetrons into said processing chamber.

24. The apparatus of claim 18 wherein said third set of computer instructions controls said microwave producing system to direct said pulsed, low wattage microwave energy from said first and second magnetrons alternately into said processing chamber.

25. The apparatus of claim 18 wherein said first set of computer instruction also includes a fifth subset of computer instructions for automatically adjusting and moveable portion of said processing chamber from said position to other positions, wherein said first time period is prior to ignition of a plasma from said reactive gas energized by said microwaves, and wherein said other positions result in resonance of said microwaves in said processing chamber during other time periods depending on changes in impedance within said processing chamber after ignition of said plasma.

26. The apparatus of claim 18 wherein said at least one magnetron is coupled to said dielectric window via a waveguide, said magnetron and said waveguide positioned in convenient locations that do not prevent easy opening of said processing chamber.

* * * * *